(12) United States Patent
Tanaka et al.

(10) Patent No.: US 7,580,014 B2
(45) Date of Patent: Aug. 25, 2009

(54) DISPLAY APPARATUS

(75) Inventors: Yukikazu Tanaka, Fussa (JP);
Tomoyuki Shirasaki, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 856 days.

(21) Appl. No.: 10/867,630

(22) Filed: Jun. 14, 2004

(65) Prior Publication Data

US 2004/0263441 A1 Dec. 30, 2004

(30) Foreign Application Priority Data

Jun. 26, 2003 (JP) ............................ 2003-182489

(51) Int. Cl.
*G09G 3/30* (2006.01)
(52) U.S. Cl. .......................................... 345/81; 345/76
(58) Field of Classification Search ................... 345/76, 345/77, 81, 204; 313/483; 315/169.3
See application file for complete search history.

(56) References Cited

U.S. PATENT DOCUMENTS

| | | | | |
|---|---|---|---|---|
| 5,796,509 | A * | 8/1998 | Doany et al. ................. | 359/254 |
| 5,998,805 | A * | 12/1999 | Shi et al. ...................... | 257/40 |
| 6,538,374 | B2 | 3/2003 | Hosokawa | |
| 6,630,784 | B2 * | 10/2003 | Yoneda ......................... | 313/504 |
| 6,706,425 | B2 * | 3/2004 | Ishii et al. ..................... | 428/690 |
| 6,741,228 | B1 | 5/2004 | Yokoyama et al. | |
| 6,882,102 | B2 * | 4/2005 | Yamazaki .................... | 313/504 |
| 6,900,597 | B2 * | 5/2005 | Kobayashi ................ | 315/169.3 |
| 7,045,861 | B2 * | 5/2006 | Takayama et al. ............ | 257/347 |
| 2003/0201716 | A1* | 10/2003 | Yamazaki et al. ........... | 313/506 |
| 2003/0230972 | A1* | 12/2003 | Cok ............................. | 313/504 |
| 2004/0017162 | A1* | 1/2004 | Sato et al. ................. | 315/169.3 |

FOREIGN PATENT DOCUMENTS

| | | |
|---|---|---|
| CN | 1286782 A | 3/2001 |
| CN | 1363200 A | 8/2002 |
| JP | 6-151063 A | 5/1994 |
| JP | 10-92579 A | 4/1998 |
| JP | 11-224783 A | 8/1999 |
| JP | 2002-33185 A | 1/2002 |
| JP | 2002-299057 A | 10/2002 |
| JP | 2002-318553 A | 10/2002 |
| JP | 2003-45674 A | 2/2003 |
| JP | 2003-508876 T | 3/2003 |
| JP | 2003-123988 A | 4/2003 |
| JP | 2004-281402 A | 10/2004 |
| KR | 2002-0000875 A | 1/2002 |
| KR | 2002-0025840 A | 4/2002 |
| WO | WO 01/62051 A1 | 8/2001 |

OTHER PUBLICATIONS

Chinese Office Action (and English translation thereof) dated Dec. 28, 2007, issued in a counterpart Chinese Application.
Japanese Office Action dated Dec. 16, 2008, and English translation thereof issued in counterpart Japanese Application No. 2003-182489.
Japanese Office Action dated Mar. 17, 2009 (2 pages), and English translation thereof (3 pages), issued in counterpart Japanese Application Serial No. 2003-182489.

* cited by examiner

*Primary Examiner*—Ricardo L Osorio
(74) *Attorney, Agent, or Firm*—Frishauf, Holtz, Goodman & Chick, P.C.

(57) ABSTRACT

A display apparatus includes a substrate, a plurality of pixel electrodes which are arrayed on a side of one surface of the substrate, EL layers each of which is formed on a corresponding one of the pixel electrodes, and an counter electrode which is formed on the EL layers. An auxiliary electrode is electrically connected to the counter electrode and overlaps portions between the pixel electrodes.

15 Claims, 21 Drawing Sheets

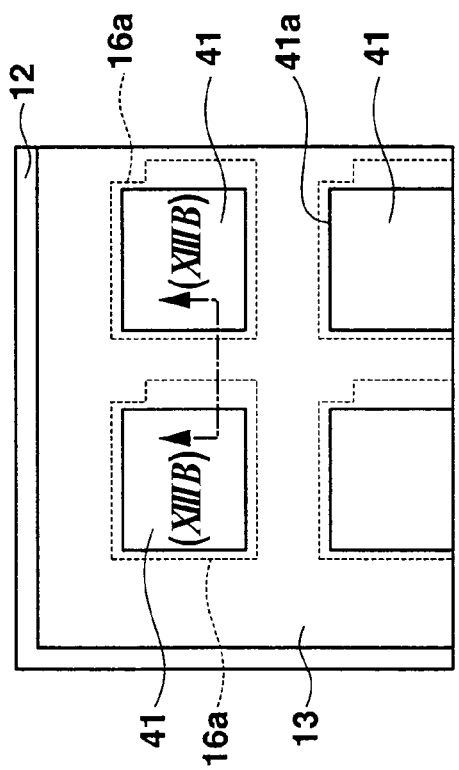
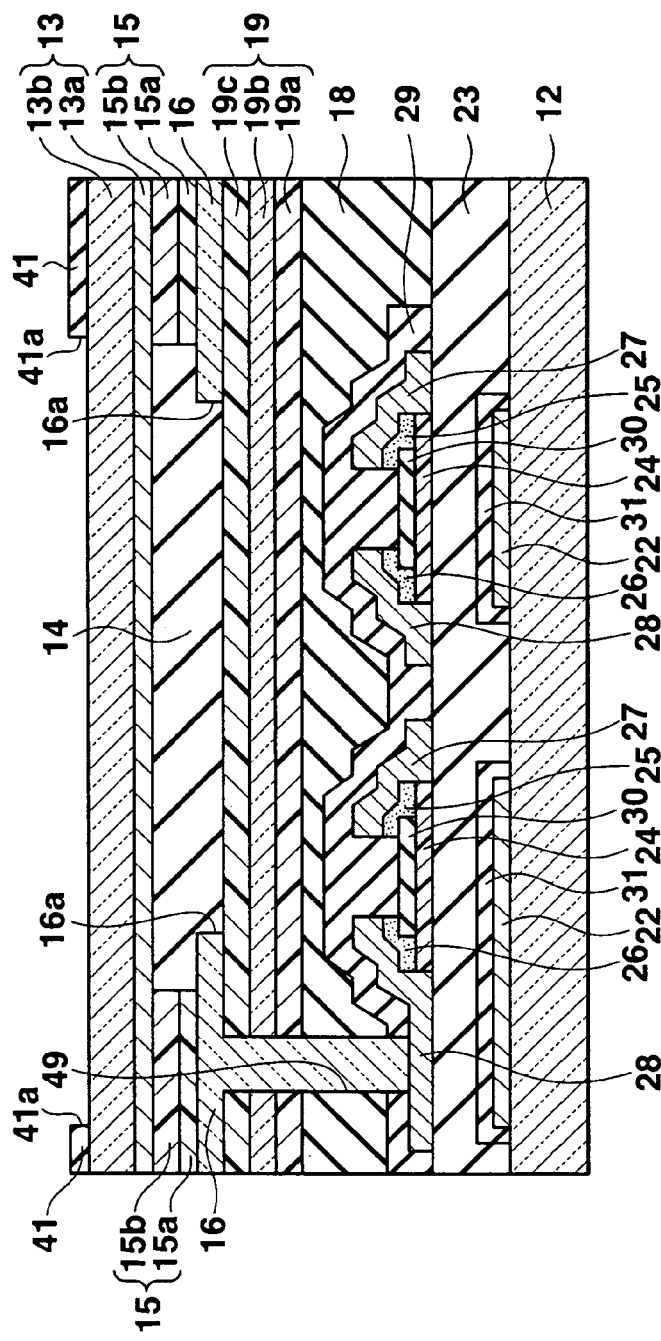
FIG.13A
FIG.13B

DISPLAY APPARATUS

CROSS-REFERENCE TO RELATED APPLICATIONS

This application is based upon and claims the benefit of priority from prior Japanese Patent Application No. 2003-182489, filed Jun. 26, 2003, the entire contents of which are incorporated herein by reference.

BACKGROUND OF THE INVENTION

1. Field of the Invention

The present invention relates to a display apparatus having light-emitting elements arrayed on a substrate.

2. Description of the Related Art

An electroluminescent element (to be abbreviated as an organic EL element) has a multilayered structure formed by forming a first electrode, an EL layer, and a second electrode on a glass substrate in this order. When a voltage is applied between the first electrode and the second electrode, holes and electrons are injected to the EL layer, and electroluminescence occurs in it. As described in Jpn. Pat. Appln. KOKAI Publication No. 6-151063, display light emitted by the EL layer emerges from the glass substrate on which the first electrode and the EL layer are formed in this order.

When a plurality of organic EL elements serving as pixels are arrayed in a matrix on a substrate, a display apparatus is provided. Such display apparatuses are roughly classified into two types: an active matrix driving system and a passive driving system (simple matrix driving system). In the active matrix driving display apparatus, the application voltage per unit time for an organic EL element is low. For this reason, the voltage applied on organic EL elements can be reduced, and the service life can be prolonged. The active matrix driving display apparatus is superior to the passive driving display apparatus in these characteristics.

In the active matrix driving display apparatus, a pixel transistor serving as a switching element is arranged in each pixel. The organic EL elements are selectively caused to emit light by the pixel transistors. In manufacturing an active matrix driving display apparatus, transistors are formed on a substrate before organic EL elements are formed in a matrix by patterning. This is because the temperature in transistor formation exceeds the heat-resistant temperature of organic EL elements.

In such a display apparatus, a transistor is formed for each pixel. In forming a plurality of organic EL elements in a matrix, first electrodes on the lower side, which are to be connected to transistors, are formed in a matrix independently for each organic EL element. On the other hand, a second electrode is formed on the entire surface of the display unit as a common electrode common to all the organic EL elements. The light-emitting region of each pixel of the display apparatus corresponds to a region where the first and second electrodes cross. In the active matrix driving display apparatus, the first electrodes can be patterned by photolithography. For this reason, pixels can be formed in a very high resolution as compared to a passive driving display apparatus because it requires second electrode patterning using a metal mask with a lower resolution than photolithography.

Light from the EL layer emerges through the glass substrate. In this case, the light incident on the glass substrate causes irregular reflection or is absorbed in the substrate because of its refractive index and thickness. Hence, a large quantity of light emitted from the EL layer is lost in the glass substrate. If the second electrode is transparent, the light from the EL layer can emerge through not the glass substrate but the second electrode. However, since a metal oxide used for a transparent electrode generally has a high electric resistance, a current hardly flows through it as compared to an opaque metal. If a single second electrode is formed as a common electrode for pixels, the light emission intensity in the plane becomes nonuniform, and more specifically, it is bright at a portion near a power supply but dark distantly from it. To obtain a sufficient sheet resistance, the second electrode must be thick. However, the transmittance becomes low in a thick second electrode.

BRIEF SUMMARY OF THE INVENTION

According to an aspect of the present invention, there is provided a display apparatus comprising: a substrate having one surface; a plurality of pixel electrodes which are arrayed on a side of the one surface of the substrate; EL layers each of which is formed on a corresponding one of the pixel electrodes; an counter electrode which is formed on the EL layers; and an auxiliary electrode which is electrically connected to the counter electrode and overlaps portions between the pixel electrodes.

In the display apparatus, the counter electrode may be transparent. The display apparatus has a structure which causes light from the EL layers to emerge through the counter electrode. Even when a material having a relatively high resistivity is used for the counter electrode, the auxiliary electrode is formed to be connected to the counter electrode and overlaps the portions between the plurality of pixel electrodes. For this reason, the total sheet resistance of the auxiliary electrode and counter electrode can be reduced without decreasing the light emergence ratio on a counter electrode surface. A variation in current density from the counter electrode to the EL layers can be improved. The current value of the current flowing through the counter electrode is almost constant, and light emission in the same pixel is uniformed. Since no strong electric field is applied to only part of the EL layer, the voltage applied on it can be reduced, and the service life can be prolonged. In the structure of a general EL panel, when the counter electrode is formed as a common electrode common to a larger number of pixels, and a metal oxide such as ITO is used to form a transparent electrode, the voltage value changes between a counter electrode portion near wiring lines which supply the voltage to the counter electrode and a counter electrode portion far apart from the wiring lines. That is, the voltage attenuates as the distance from the wiring lines increases, and the light emission luminance may be nonuniform in the plurality of pixels in the plane. This problem becomes more conspicuous as the area of the counter electrode increases. In the above present apparatus, however, since the auxiliary electrode may be formed in correspondence with the area level for each pixel, any variation in the applied voltage or the current value of the flowing current depending on the relative position between the wiring lines and each pixel can be suppressed. Even if signals of equipotential are output between all the pixels and the counter electrode, all the EL layers can emit light almost at the same intensity, and the light emission intensity in the plane can be uniformed.

In addition, since the counter electrode can be made thinner, the transmittance of the counter electrode to the light emitted by the EL layers can be increased. Furthermore, since the auxiliary electrode is arranged between the pixel electrodes, i.e., between the EL layer of a pixel electrode and the EL layer of an adjacent pixel electrode, the decrease in aperture ratio can be minimized.

When the counter electrode is transparent, and the auxiliary electrode has a light-shielding effect, light emitted by the EL layers emerges outside from the counter electrode. Generally, a transparent electrode material has a high resistivity. Hence, the decrease in sheet resistance by the auxiliary electrode is more effective. In addition, since the auxiliary electrode has the light-shielding effect, it functions as a light-shielding film between the pixel electrodes to prevent any decrease in contrast and color purity and any light leakage between the pixel electrodes (between the EL layers). Only the counter electrode is present as the layer between the EL layers and the auxiliary electrode. The auxiliary electrode is arranged close to the EL layers. For these reasons, even when the EL layers radially emit light, the prevention efficiency of the auxiliary electrode for decrease in contrast ratio and color purity and the light leakage is very high. Hence, the light can efficiently emerge outside from the counter electrode.

When a light-shielding mask overlapping the auxiliary electrode is formed on it, any decrease in contrast and color purity and any light leakage between the pixel electrodes (between the EL layers) can be prevented.

When the auxiliary electrode is formed into a mesh shape to overlap the entire region between the plurality of pixel electrodes, the voltage of the counter electrode can be more uniformed in the plane.

When the display apparatus further comprises an resonator which resonates at least some light components of light emitted by the EL layers, the emergence ratio of the wavelength range of a predetermined color of the light from the EL layers can be increased. Hence, the color purity can be increased.

The resonator may comprise a half-reflecting layer which is arranged under the pixel electrodes, a transparent layer which is formed under the half-reflecting layer while being in contact with the half-reflecting layer, and a reflecting layer which is formed under the transparent layer while being in contact with the transparent layer, a light transmittance increases in an order of the reflecting layer, the half-reflecting layer, and the transparent layer, a light reflectance increases in an order of the transparent layer, the half-reflecting layer, and the reflecting layer, and the pixel electrodes are transparent. In this case, of external light that enters the transparent layer, each component whose wavelength is not an integral multiple of ½ of the optical thickness of the transparent layer hardly emerges from the resonator even when the component causes interference while repeating reflection. Hence, the component is rarely reflected from the display apparatus. For this reason, glare caused by external light can be suppressed. Even when the display apparatus exists under a bright environment, any decrease in contrast ratio can be suppressed. Hence, a display apparatus of high visibility for a user can be provided.

The apparatus further comprises a transparent layer which is formed under the pixel electrodes while being in contact with the pixel electrodes, and a reflecting layer which is formed under the transparent layer while being in contact with the transparent layer, and in which a light transmittance increases in an order of the reflecting layer, the pixel electrodes, and the transparent layer, and a light reflectance increases in an order of the transparent layer, the pixel electrodes, and the reflecting layer. In this case, the pixel electrodes form part of the resonator. Hence, reflection of external light can be suppressed by a smaller number of components.

According to another aspect of the present invention, there is provided a display apparatus comprising a plurality of pixel electrodes which are arrayed on a side of one surface of a substrate; an auxiliary electrode which is provided around the pixel electrodes and is electrically connected to the pixel electrodes, is separated from the pixel electrodes; EL layers each of which is formed on a corresponding one of the pixel electrodes; and a counter electrode which is formed on the EL layers.

In the display apparatus according to this aspect, the sheet resistance can be reduced by combining the auxiliary electrode and pixel electrodes. For this reason, the EL layers can efficiently be caused to emit light at a low voltage. In addition, since the auxiliary electrode is arranged between the pixel electrodes, i.e., between the EL layer of a pixel electrode and the EL layer of an adjacent pixel electrode, the decrease in aperture ratio can be minimized.

According to still another aspect of the present invention, there is provided a display apparatus comprising: a plurality of pixel electrodes which are arrayed on a side of one surface of a substrate; EL layers each of which is formed on a corresponding one of the pixel electrodes; a counter electrode which is formed on the EL layers; an auxiliary electrode which is electrically connected to the counter electrode and overlaps portions between the plurality of pixel electrodes; a plurality of current lines; a switch circuit which supplies a storage current having a predetermined current value to the current line during a selection period and stops supplying the current to the current line during a nonselection period; and a plurality of current storage circuits which store current data corresponding to the current value of the storage current which flows through the current line during the selection period and supply a display current having a current value substantially equal to the storage current to the EL layer through the pixel electrode during the nonselection period in accordance with the current data stored during the selection period.

Even when the display luminance is gray-level-controlled by the current value of a signal, like the storage current, the sheet resistance can be reduced by combining the auxiliary electrode and counter electrode. In addition, since the auxiliary electrode is arranged between the pixel electrodes, i.e., between the EL layer of a pixel electrode and the EL layer of an adjacent pixel electrode, the decrease in aperture ratio can be minimized.

BRIEF DESCRIPTION OF THE SEVERAL VIEWS OF THE DRAWING

FIG. 13A is a view showing a step following FIG. 12A;

FIG. 13B is a sectional view taken along a line (XIIIB)-(XIIIB) in FIG. 13A;

DETAILED DESCRIPTION OF THE INVENTION

Detailed embodiments of the present invention will be described below with reference to the accompanying drawings. However, the scope of the present invention is not limited to the illustrated examples. In the following description, "viewed from the upper side" means "viewed perpendicularly to the display surface".

Figure 1:
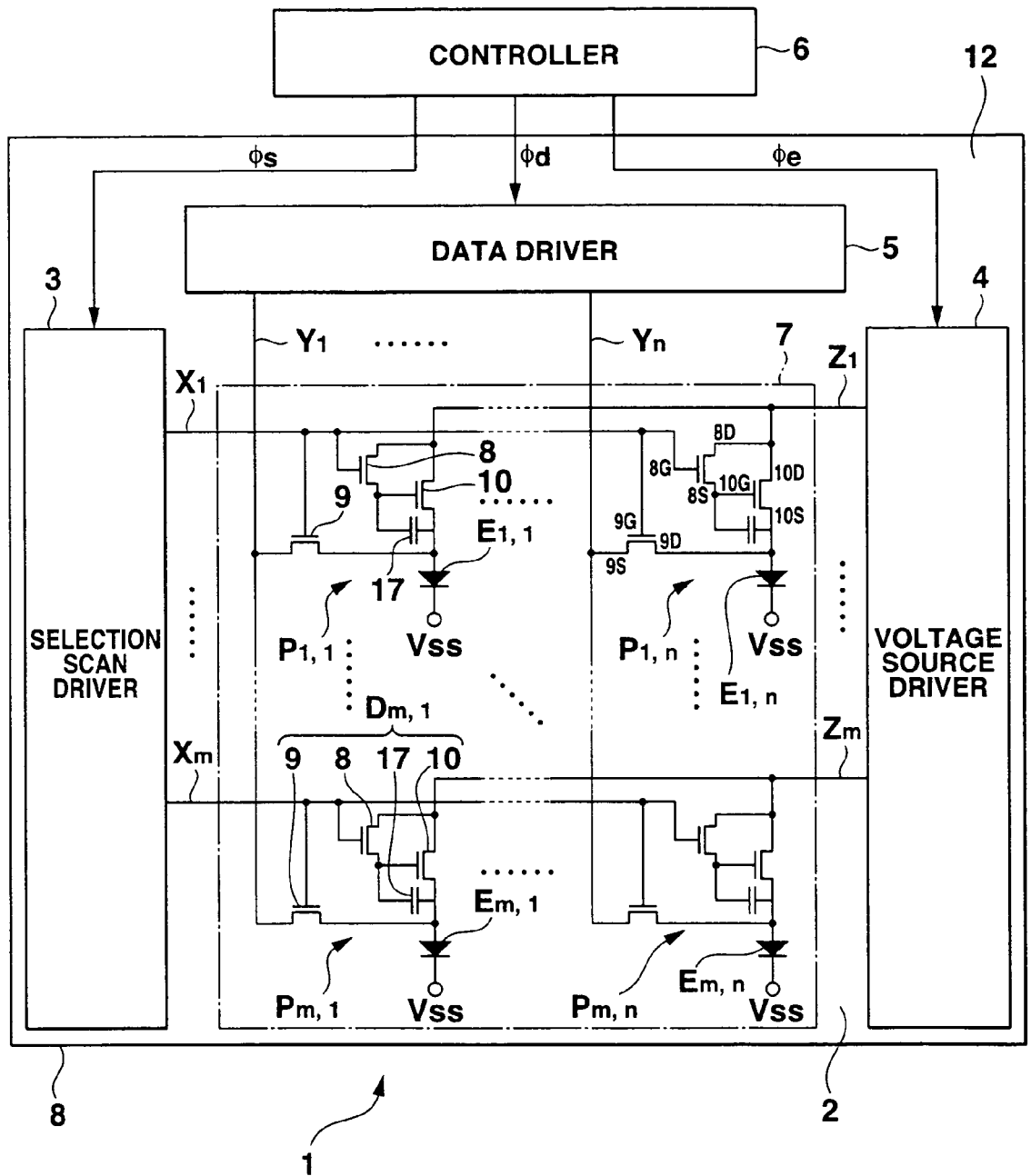
FIG. 1 is a plan view showing a display apparatus according to an embodiment of the present invention.

FIG. 1 is a block diagram schematically showing an entire arrangement of a display apparatus to which the present invention is applied. As shown in FIG. 1, the display apparatus 1 is a so-called active matrix driving display apparatus which comprises, as the basic arrangement, an active matrix display panel 2 and a controller 6 which controls the entire light-emitting display 1. The display panel 2 includes a substrate 12 (FIG. 4) made of borosilicate glass, silica glass, or glass of another type, which has a resistance to the temperature during a transistor manufacturing process (to be described later), a display unit 7 which is formed on the substrate 12, as a plurality of pixels, and emits light to display an image corresponding to image data from the controller 6, and a selection scan driver 3, voltage source driver 4 and data driver 5, which are formed on the substrate 12 to drive the pixels of the display unit 7. The selection scan driver 3, voltage source driver 4, and data driver 5 are connected to be able to receive data and control signals φs, φe, and φd from the controller 6, respectively. The display panel 2 is formed by arranging various kinds of wiring lines and elements on the substrate 12. The substrate 12 need not always have a high transmittance for visible light.

In the display panel 2, $\underline{m}$ selection scan lines $X_1, X_2, \ldots, X_m$ are formed on the substrate 12 while being arrayed parallel to each other along the row direction. In addition, $\underline{m}$ voltage source scan lines $Z_1, Z_2, \ldots, Z_m$ are formed on the substrate 12 along the row direction. The voltage source scan lines $Z_1, Z_2, \ldots, Z_m$ and the selection scan lines $X_1, X_2, \ldots, X_m$ are alternately arranged to form pairs. The voltage source scan lines $Z_1, Z_2, \ldots, Z_m$ are electrically insulated from the selection scan lines $X_1, X_2, \ldots, X_m$. Current lines $Y_1, Y_2, \ldots, Y_n$ are formed on the substrate 12 along the column direction perpendicular to the row direction. The selection scan lines $X_1, X_2, \ldots, X_m$ and voltage source scan lines Zip $Z_2, \ldots, Z_m$ can be formed at once by patterning a single conductive film. The current lines $Y_1, Y_2, \ldots, Y_n$ cross the selection scan lines $X_1, X_2, \ldots, X_m$ and voltage source scan lines $Z_1, Z_2, \ldots, Z_m$ The selection scan lines $X_1, X_2, \ldots, X_m$ and voltage source scan lines $Z_1, Z_2, \ldots, Z_m$ are insulated from the current lines $Y_1, Y_2, \ldots, Y_n$ by a gate insulating film 23 and semiconductor film 24 (to be described later).

A plurality of organic EL elements are arrayed in a matrix on the substrate 12. Each organic EL element is formed in each region surrounded by adjacent two of the current lines Y, $Y_2, \ldots, Y_n$ and adjacent two of the selection scan lines $X_1, X_2, \ldots, X_m$. A driving circuit to supply a predetermined current to the organic EL element is formed about that organic EL element. One organic EL element and a driving circuit arranged for it correspond to one pixel of the display panel 2. That is, one organic EL element is formed for each of (m×n) pixels.

The display panel 2 will be described below in detail.

A plurality of pixels $P_{1,1}$ to $P_{m,n}$ (m≧1, and n≧2) are formed in a matrix in the display unit 7 in the display panel 2. In a pixel $P_{i,j}$ (1≦i≦m, and 1≦j≦n) of the ith row and jth column, an organic EL element $E_{i,j}$ of the ith row and jth column and a pixel driving circuit $D_{i,j}$ of the ith row and jth column, which drives the organic EL element $E_{i,j}$, are formed. The pixel driving circuit $D_{i,j}$ comprises a capacitor 17, first transistor 8, second transistor 9, and third transistor 10. The transistors are n-channel amorphous silicon thin-film transistors.

A gate electrode 8G of the first transistor 8 of the pixel driving circuit $D_{i,j}$ is connected to a selection scan line $X_i$ of the ith row. A drain electrode 8D is connected to a voltage source scan line $Z_i$ of the ith row. A source electrode 8S is connected to a gate electrode 10G of the third transistor 10 and one electrode of the capacitor 17.

A gate electrode 9G of the second transistor 9 of the pixel driving circuit $D_{i,j}$ is connected to the selection scan line $X_i$ of the ith row. A drain electrode 9D is connected to a source electrode 10S of the third transistor 10 and the other electrode of the capacitor 17. A source electrode 9S is connected to a current line $Y_j$ of the jth column.

The gate electrode 10G of the third transistor 10 of the pixel driving circuit $D_{i,j}$ is connected to the source electrode 8S of the first transistor 8 and one electrode of the capacitor 17, as mentioned above. A drain electrode 10D is connected to the voltage source scan line $Z_i$. The source electrode 10S is connected to a pixel electrode as one electrode of the organic EL element $E_{i,j}$, the other electrode of the capacitor 17, and the drain electrode 9D of the second transistor 9.

The capacitor 17 is connected between the gate electrode 10G and the source electrode 10S of the third transistor 10. The capacitor 17 has a function of holding the potential between the gate electrode 10G and the source electrode 10S.

Figure 6:
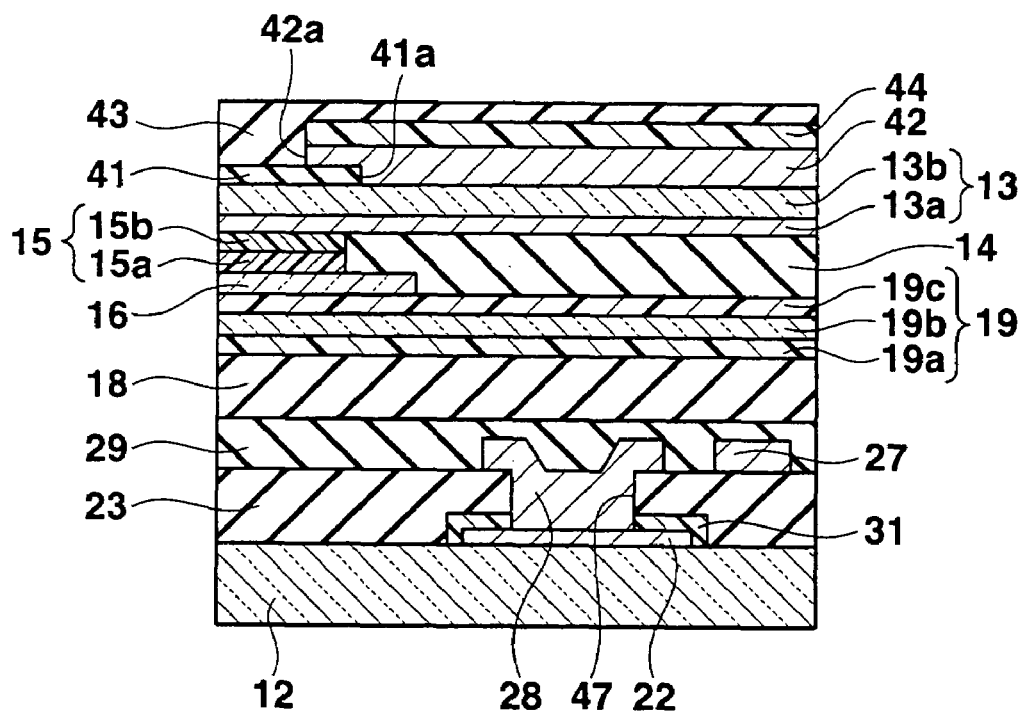
FIG. 6 is a sectional view taken along a line (VI)-(VI) in FIG. 3 in a direction of thickness.

The organic EL element $E_{i,j}$ has a structure in which an organic EL layer 15 is sandwiched between a pixel electrode 16 and a counter electrode 13, as shown in FIG. 6. The pixel electrode is connected to the source electrode 10S of the third transistor 10. A reference potential $V_{SS}$ is applied to the counter electrode 13.

Figure 2:
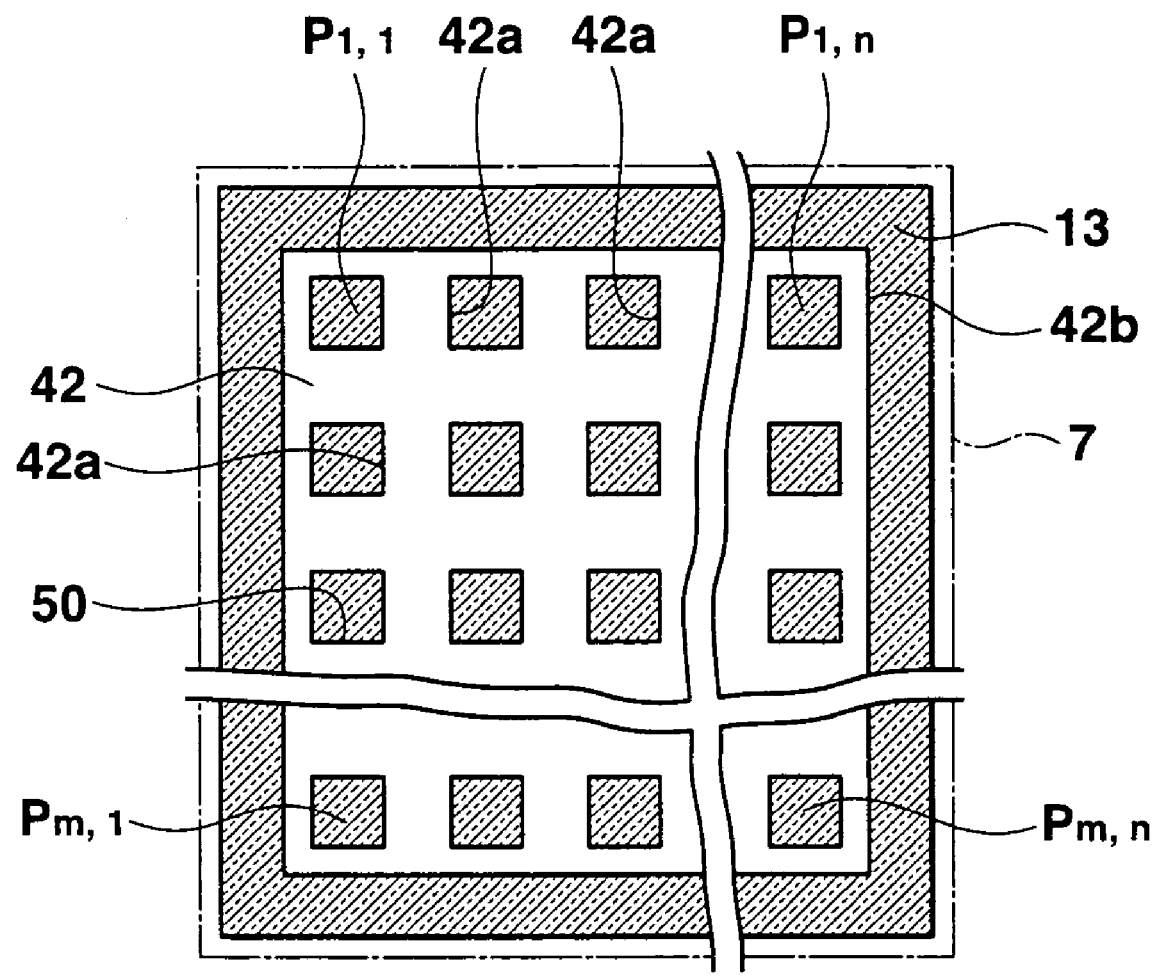
FIG. 2 is a plan view showing a counter transparent electrode and auxiliary electrode layer of organic EL elements in the display unit of the display apparatus shown in FIG. 1.

In the display unit 7, as shown in FIG. 2, the counter transparent electrode 13 serving as the common electrode of organic EL elements $E_{1,1}$ to $E_{m,n}$ is formed all over the plurality of pixels $P_{1,1}$ to $P_{m,n}$. An auxiliary electrode layer 42 is formed in contact with the counter transparent electrode 13. The auxiliary electrode layer 42 is made of a conductive material whose resistivity is lower than a transparent conductive layer 13b (FIGS. 5 and 6) of the counter transparent electrode 13. The auxiliary electrode layer 42 has a function of reducing the sheet resistance of the electrode including both itself and the counter transparent electrode 13. Since this conductive material is opaque to visible light, the auxiliary electrode layer 42 has opening portions 42a corresponding to the pixels. The organic EL layer 15 (to be described later), and the pixel electrode 16 and the counter transparent electrode 13, which are located on both surfaces of the organic EL layer 15, are exposed to the region in each opening portion 42a. Hence, the auxiliary electrode layer 42 covers the selection scan lines $X_1$ to $X_m$, current lines $Y_1$ to $Y_n$, and voltage source scan lines $Z_1$ to $Z_m$ around the organic EL elements $E_{1,1}$ to $E_{m,n}$. In addition, to prevent glare caused by external light reflection on the source and drain electrodes of the first transistors 8, second transistors 9, and third transistors 10 of pixel driving circuits $D_{1,1}$ to $D_{m,n}$, the auxiliary electrode layer 42 preferably covers the first transistors 8, second transistors 9, and third transistors 10 of the pixel driving circuits $D_{i,j}$. If external light reflection occurs even on the capacitor 17, it is also preferably covered with the auxiliary electrode layer 42.

Figure 3:
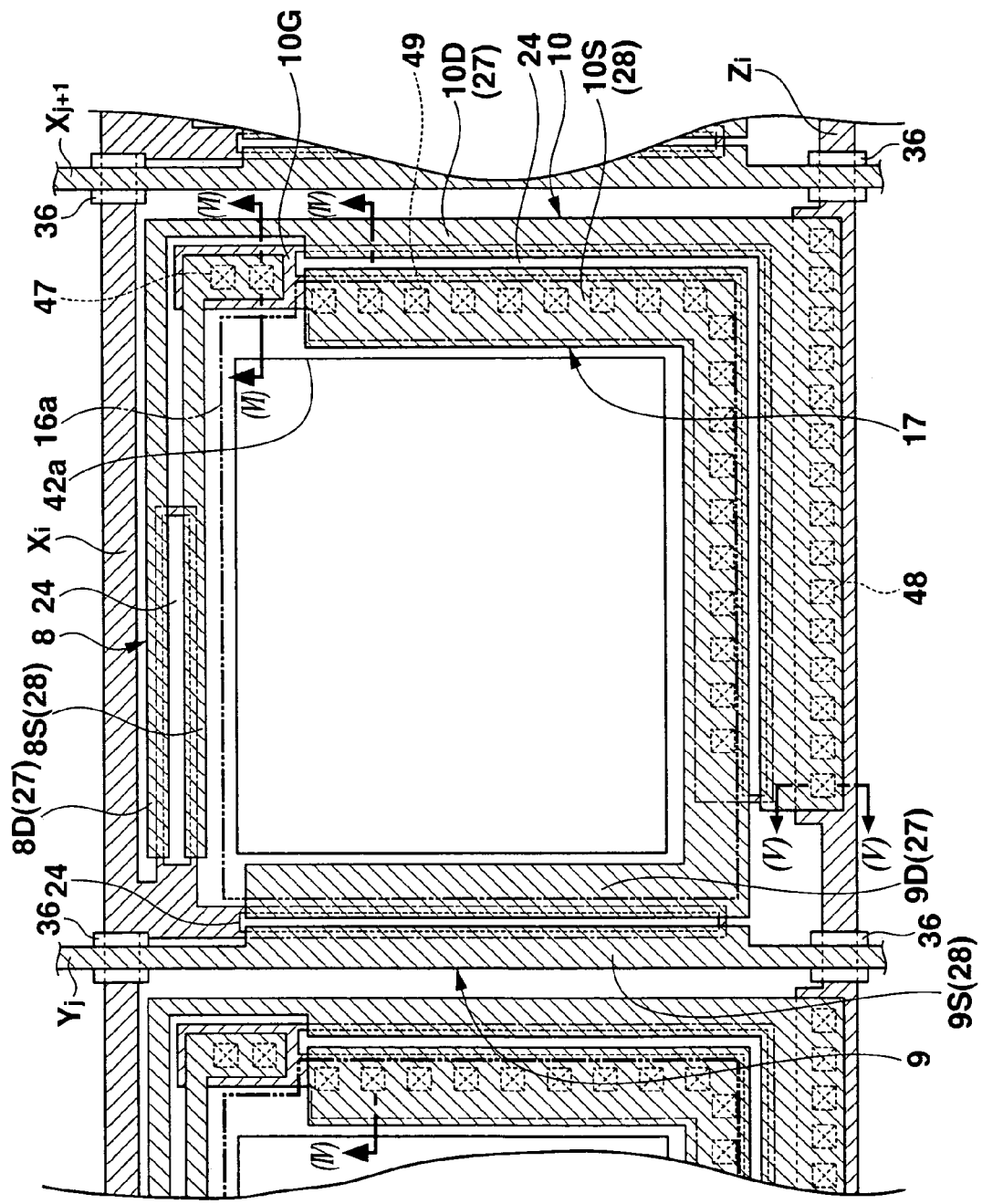
FIG. 3 is a plan view of a pixel driving circuit $D_{i,j}$ in a pixel $P_{i,j}$.
Figure 4:
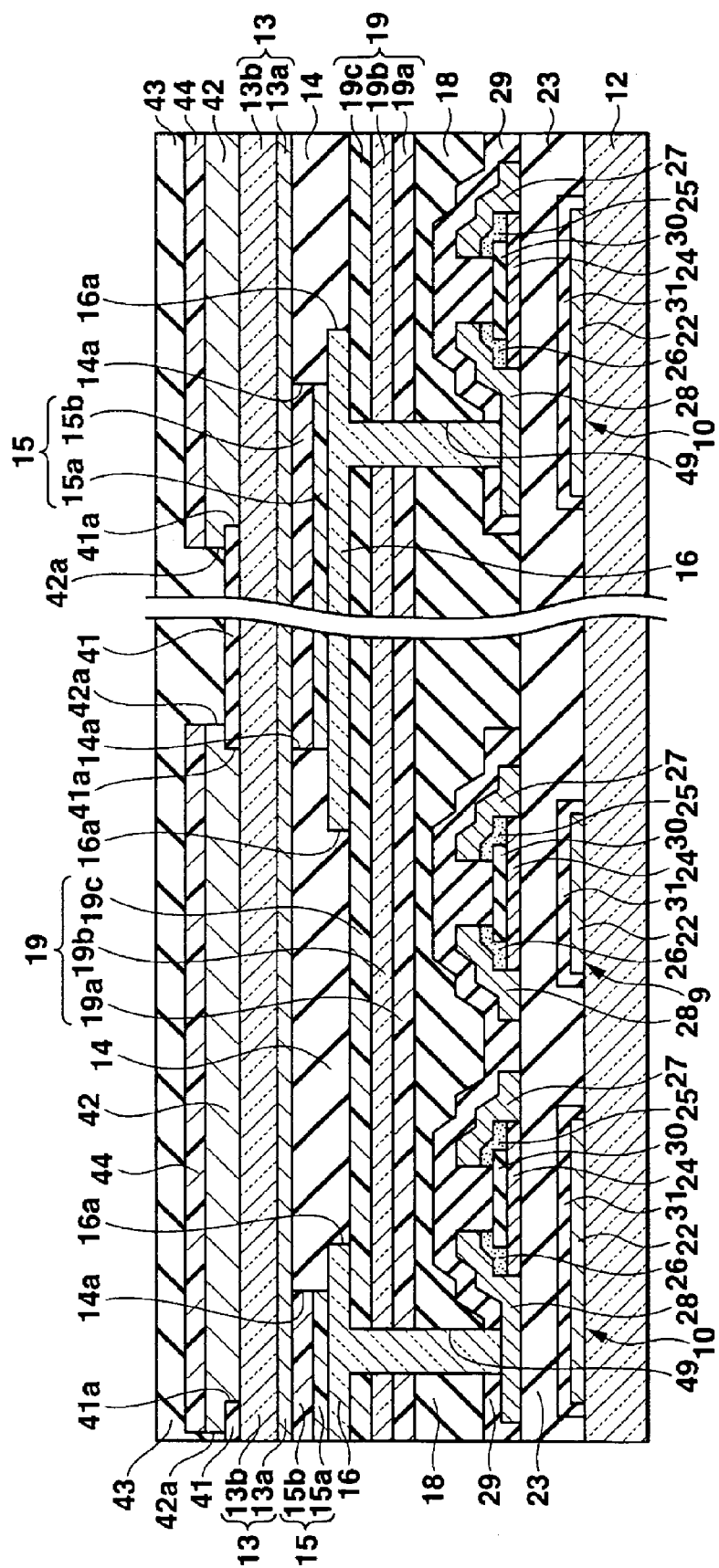
FIG. 4 is a sectional view taken along a line (IV)-(IV) in FIG. 3 in a direction of thickness.
Figure 5:
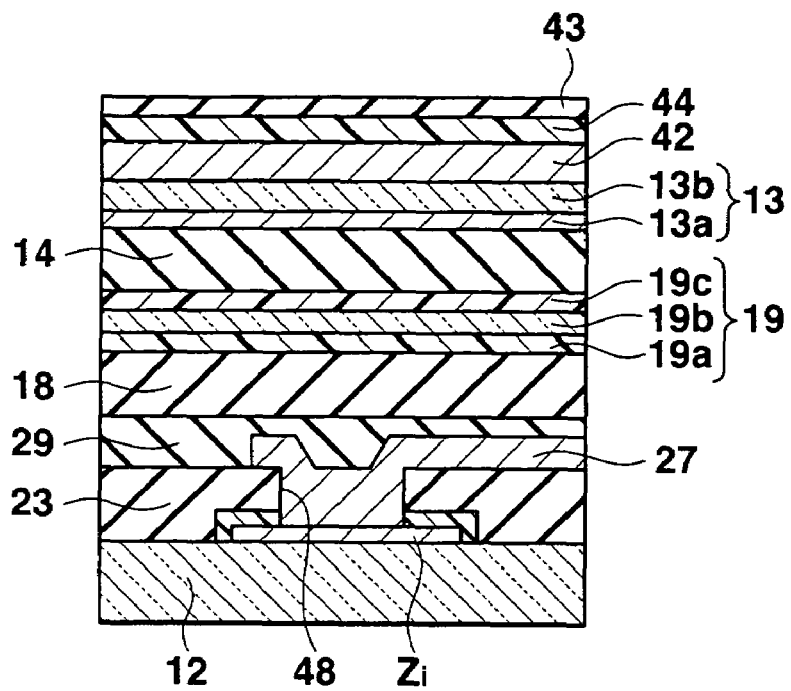
FIG. 5 is a sectional view taken along a line (V)-(V) in FIG. 3 in a direction of thickness.

The pixel $P_{i,j}$ will be described here in detail. FIG. 3 is a schematic view showing the pixel driving circuit $D_{i,j}$ in the pixel $P_{i,j}$ viewed from the upper side. FIG. 4 is a sectional view taken along a line (IV)-(IV) in FIG. 3 in a direction of thickness. FIG. 5 is a sectional view taken along a line (V)-(V) in FIG. 3 in a direction of thickness. FIG. 6 is a sectional view taken along a line (VI)-(VI) in FIG. 3 in a direction of thickness. To help understanding, the gate insulating film 23 (to be described later), a first impurity-doped semiconductor film 25, a second impurity-doped semiconductor film 26, a block insulating film 36, and the counter transparent electrode 13 are not at least partially illustrated in FIG. 3.

A gate electrode layer 22 having a predetermined pattern, which serves as the gate electrode 8G of the first transistor 8, the gate electrode 9G of the second transistor 9, and the gate electrode 10G of the third transistor 10, is formed on the substrate 12. The gate electrode layer 22 is formed by patterning the same conductive material layer as the selection scan lines $X_1, X_2, \ldots, X_m$ and voltage source scan lines $Z_1, Z_2, \ldots, Z_m$ at once. The gate electrode layer 22 has a low-resistant material such as chromium, aluminum, copper, titanium, or tungsten or an alloy selected from at least some of them.

An anodic oxide film 31 is formed on the gate electrode layer 22 by anodizing its peripheral surface. The gate insulating film 23 is formed to cover the entire surface of the display unit 7. The gate insulating film 23 is made of a translucent and insulating material such as silicon nitride or silicon oxide. The gate insulating film 23 covers even the selection scan lines $X_1, X_2, \ldots, X_m$ and voltage source scan lines $Z_1, Z_2 \ldots, Z_m$.

The semiconductor films 24 of the first transistor 8, second transistor 9, and third transistor 10 are formed to oppose the gate electrode layers 22 through parts of the gate insulating film 23. The semiconductor film 24 is made of intrinsic amorphous silicon having a spectral sensitivity from visible light to the infrared wavelength range. A blocking insulating film 30 made of silicon nitride is formed on each semiconductor film 24 to protect its surface from an etchant. The first impurity-doped semiconductor film 25 and second impurity-doped semiconductor film 26 separated from each other are formed on both and portions of each semiconductor film 24 and each blocking insulating film 30. The second impurity-doped semiconductor film 26 thus covers one side of the semiconductor film 24 and one side of the blocking insulating film 30. The second impurity-doped semiconductor film 26 also covers the other side of the semiconductor film 24 and the other side of the blocking insulating film 30. The first impurity-doped semiconductor film 25 and second impurity-doped semiconductor film 26 are made of amorphous silicon doped with n-type impurity ions.

A drain electrode layer 27 serving as the drain electrodes 8D, 9D, and 10D is formed on the first impurity-doped semiconductor films 25 of the first transistor 8, second transistor 9, and third transistor 10. A source electrode layer 28 serving as the source electrodes 8S, 9S, and 10S is formed on the second impurity-doped semiconductor films 26 of the first transistor 8, second transistor 9, and third transistor 10. The drain electrode layer 27 and source electrode layer 28 are formed by patterning the same conductive material layer as the current lines $Y_1$ to $Y_n$ at once. The drain electrode layer 27 and source electrode layer 28 are made of a low-resistant material such as chromium, aluminum, copper, titanium, or tungsten or an alloy selected from at least some of them and have a function of shielding visible light. With this structure, any external light or light from each organic EL element is suppressed from becoming incident on the semiconductor film 24, first impurity-doped semiconductor film 25, and second impurity-doped semiconductor film 26. The source electrode layer 28 and drain electrode layer 27 are separated and accordingly electrically insulated from each other.

The first transistor 8, second transistor 9, and third transistor 10 may have not the inverted staggered structure but a coplanar structure. At least some of them may be p-channel transistors. The transistors may be made of not amorphous silicon but, e.g., polysilicon. To prevent photo-deterioration of the first transistor 8, second transistor 9, and third transistor 10, the substrate 12 may have a light-shielding effect.

A protective insulating film 29 made of silicon nitride is formed to cover the first transistor 8, second transistor 9, third transistor 10, capacitor 17, selection scan lines $X_1, X_2, \ldots, X_m$, current lines $Y_1, Y_2, \ldots, Y_n$, and voltage source scan lines $Z_1, Z_2$.

The third transistor 10 having the above structure is an MOSFET having the semiconductor film 24 as a channel region. The first transistor 8 and second transistor 9 have almost the same structure as the above-described third transistor 10. One electrode of the capacitor 17 is also used as the gate electrode layer 22 of the third transistor 10. The other electrode of the capacitor is also used as the source electrode layer 28 of the third transistor 10. The capacitor 17 uses the gate insulating film 23 formed between one electrode and the other electrode as a dielectric. Accordingly, the capacitor 17 functions as a capacitor which stores, as charge data, the gate-to-source potential of the third transistor 10 corresponding to the value of a current flowing between the source and the drain of the third transistor 10. That is, the capacitor 17 stores charge data written as the parasitic capacitance between the gate and the source of the third transistor 10. The capacitor 17 holds the charges stored between the gate and the source of the third transistor 10 so as to supply a current having the same value as in the write between the source and the drain of the third transistor 10 when a predetermined voltage is applied between the source and the drain of the third transistor 10.

The protective insulating film 29 is covered with an insulating planarization film 18 made of, e.g., polyimide. The insulating planarization film 18 functions as a planarization film formed over the entire surface of the substrate 12. Steps generated between the parts of the protective insulating film 29 on the first transistor 8, second transistor 9, and third transistor 10 and a part of the protective insulating film 29 on the surface of the substrate 12 are canceled by the insulating planarization film 18. Hence, the insulating planarization film 18 has an almost flat upper surface. The insulating planarization film 18 is made of a resin (e.g., methacrylate resin, acrylic resin, or epoxy resin). To prevent photo-deterioration of the first transistor 8, second transistor 9, and third transistor 10, the insulating planarization film 18 may have a light-shielding effect by containing a pigment such as carbon black.

An optical interference layer 19 is formed on the insulating planarization film 18 in correspondence with the entire surface of the display unit 7. The optical interference layer 19 is formed by forming, sequentially from the side of the insulating planarization film 18, a reflecting layer 19a which reflects light from the upper side by specular reflection, an optically transparent layer 19b which is set to a predetermined thickness and predetermined refractive index, and a half-reflecting layer 19c which functions as a half-mirror. The optical interference layer 19 is optically designed such that the reflectance to light in the visible light wavelength range increases in the order of transparent layer 19b, half-reflecting layer 19c, and reflecting layer 19a, and the transmittance to light in the visible light wavelength range increases in the order of reflecting layer 19a, half-reflecting layer 19c, and transparent layer 19b. The reflecting layer 19a is a film made of a metal such as Ag, Pt, Cu, or Sn or an alloy thereof and having a smooth upper surface with a metallic luster. The transparent layer 19b is made of a dielectric such as silicon oxide or titanium oxide. The transparent layer 19b can have a single-layered structure but preferably has a multilayered structure. To make the optical interference layer 19 have an optical thickness corresponding to the light emission wavelength of each organic EL element which emits light of red, green, or blue (to be described later), optical interference layers may be arrayed in a plurality of independent matrices for each pixel or a pixel group of each color when viewed from the upper side. The optical interference layer 19 may have a single-layered structure.

The drain electrode layer 27 of each third transistor 10 is connected to one of the voltage source scan lines $Z_1, Z_2, \ldots, Z_m$ through a contact hole 48 formed in the gate insulating film 23 and anodic oxide film 31.

The source electrode layer 28 of each first transistor 8 and the gate electrode layer 22 of a corresponding one of the third transistors 10 are connected through a contact hole 47 formed in the gate insulating film 23 and anodic oxide film 31.

The organic EL elements $E_{1,1}$ to $E_{m,n}$ are formed on the optical interference layer 19. Each of the organic EL elements $E_{1,1}$ to $E_{m,n}$ has a multilayered structure in which the pixel electrode 16 functioning as, e.g., an anode electrode, the EL layer 15 which causes electroluminescence when a current equal to or more than a threshold value flows, and the counter transparent electrode 13 functioning as, e.g., a cathode electrode are formed in this order.

The pixel electrode 16 is connected to the source electrode layer 28 of the third transistor 10 through a contact hole 49 formed in the insulating planarization film 18, optical interference layer 19, and protective insulating film 29.

The pixel electrodes 16 are independently formed while being separated from each other to electrically separate the pixels. A plurality of pixel electrodes 16 are arrayed in a matrix when viewed from the upper side.

On a portion of the optical interference layer 19 around the pixel electrode 16, a liquid-repellent film 14 which repels a liquid is formed while overlapping part of an edge portion 16a of the pixel electrode 16. The liquid-repellent film 14 has an opening portion 14a at a position corresponding to the central portion of the pixel electrode 16. The EL layer 15 is deposited in the opening portion 14a. The EL layer 15 is made of a light-emitting material. The EL layer 15 emits light by recombining carriers (holes) injected from the pixel electrode 16 and carriers (electrons) injected from the counter transparent electrode 13. The EL layer 15 of each of the organic EL elements $E_{1,1}$ to $E_{m,n}$ of the pixels $P_{1,1}$ to $P_{m,n}$ emits light of red, green, or blue. The EL layers 15 are arrayed such that the colors are periodically arranged. The EL layers 15 which emit light of the same color may be arrayed in the same column. Alternatively, the red, green, and blue EL layers 15 may be arrayed in a delta array.

The pixel electrode 16 is conductive and transparent to visible light. As long as it functions as an anode, the work function is preferably relatively high. The pixel electrode 16 is made of, e.g., indium oxide, zinc oxide, or tin oxide, or a mixture containing at least one of them (e.g., indium tin oxide (ITO), indium zinc oxide, or cadmium tin oxide (CTO)). When the pixel electrode 16 is formed as a half mirror, the half-reflecting layer 19c can be omitted. In this case, the reflectance to light in the visible light wavelength range increases in the order of transparent layer 19b, pixel electrode 16, and reflecting layer 19a, and the transmittance to light in the visible light wavelength range increases in the order of reflecting layer 19a, pixel electrode 16, and transparent layer 19b. Even in this case, the optical thickness of the transparent layer 19b is an integral multiple of ½ of the dominant wavelength (peak wavelength) of light emitted from the EL layer 15 of the organic EL element. When the optical interference layer 19 is omitted, the pixel electrode 16 need not always be transparent. The pixel electrode 16 preferably has reflective to light in the visible light wavelength range.

The EL layer 15 may appropriately contain either an electron transport substance that transports electrons by an electric field or a hole transport substance that transports holes by an electric field, or both an electron transport substance and a hole transport substance. More specifically, the EL layer 15 may have a three-layered structure including a hole transport layer, a light-emitting layer, and an electron transport layer sequentially formed from the pixel electrode 16. The EL layer 15 may have a two-layered structure sequentially including a hole transport layer and a light-emitting layer or a two-layered structure sequentially including a light-emitting layer and an electron transport layer. The EL layer 15 may have a single-layered structure including a light-emitting layer. Alternatively, the EL layer 15 may have a multilayered structure in which an electron or hole injection layer is inserted between appropriate layers in one of the above layer structures. All the layers included in the EL layer 15 may be made of organic compounds. Alternately, all the layers included in the EL layer 15 may be made of inorganic compounds. The EL layer 15 may be formed by stacking a layer made of an inorganic compound and a layer made of an organic compound. When all the layers included in the EL layer 15 are made of inorganic compounds, an inorganic EL element is formed in place of an organic EL element. When the EL layer 15 includes a layer of an organic compound, an organic EL element is formed.

When the EL layer 15 is made of a low molecular weight organic material or an inorganic substance, the EL layer 15 can be formed by epitaxial growth such as deposition or sputtering. When the EL layer 15 is made of, e.g., a polymer organic material, an organic compound containing liquid containing a polymer organic material, which is formed on the display unit 7 by wet film formation, repels the surface of the liquid-repellent film 14. Hence, no film is formed on the liquid-repellent film 14. Instead, a film can selectively be formed in the opening portion 14a corresponding to each of the pixels $P_{1,1}$ to $P_{m,n}$, i.e., on each pixel electrode 16. The organic compound containing liquid is a liquid containing an organic compound as the material of the EL layer 15 or its precursor. This liquid may be a solution prepared by dissolving, as a solute, the organic compound as the material of the EL layer 15 or its precursor in a medium. Alternatively, the liquid may be a dispersion prepared by dispersing the organic compound as the material of the EL layer 15 or its precursor in a dispersion medium.

The light-emitting layer of the EL layer 15 is made of a light-emitting material. As the light-emitting material, a polymer-based material may be used. Examples of polymer-based materials are polycarbazole-, polyparaphenylene-, polyallylenevinylene-, polythiophene-, polyfluorene-, polysilane-, polyacetylene-, polyaniline-, polypyridine-, polypyridinevinylene-, and polypyrrole-based materials. Examples of polymer materials are a polymer or copolymer of the monomer or oligomer of one of the above polymer materials (polymers), a polymer or copolymer of the derivative of the monomer or oligomer, or a polymer or copolymer prepared by polymerizing a monomer having an oxazole (oxandiazole, triazole, or diazole) or triphenylamine skeleton. The monomers of these polymers include monomers and precursor polymers which form the above-described compounds upon receiving heat, pressure, UV, or electron beam. A disconjugate unit which bonds the monomers may be introduced.

Detailed examples of the polymer materials are polyfluorene, polyvinylcarbazole, polydodecylthiophene, polyethylenedioxythiophene, sulfonate dispersoid polystyrene derivative, poly-9.9-dialkyl fluorene, poly(thienylene-9.9-dialkyl fluorene), poly(2.5-dialkyl paraphenylene-thienylene), (dialkyl: R=C1 to C20), polyparaphenylenevinylene, poly(2-methoxy-5-(2'-ethyl-hexyloxy)-paraphenylenevinylene), poly(2-methoxy-5-(2'-ethyl-pentyloxy)-paraphenyleneviny lene), poly(2.5-dimethyl-paraphenylenevinylene), poly(2.5-thienylenevinylene), poly(2.5-dimethoxyparaphenylenevinylene), and poly(1.4-paraphenylenevinylenecyanovinylene).

The material is not limited to these polymer materials. The light-emitting layer may be formed by depositing a low molecular weight material. A low molecular weight material having a certain characteristic may be dissolved in a medium and applied. A low molecular weight material may be dispersed in a polymer as a dopant. Various kinds of polymers including known general-purpose polymers can be used as the polymer in which a low molecular weight material is polymer-dispersed.

The EL layer 15 is formed by wet film formation and has a two-layered structure in which a hole transport layer 15a made of PEDOT (polythiophene) as a conductive polymer and PSS (polystyrene sulfonate) as a dopant, and a light-emitting layer 15b made of a polyfluorene-based light-emitting material are formed in this order. When the EL layer 15 is formed by wet film formation, preferably, a lyophilic film having a characteristic (to be referred to as a "lyophilic effect" hereinafter) representing that the film surface wets well with a liquid at a contact angle of 40° or less is formed on the pixel electrode 16, and in this state, an organic compound containing liquid is applied to the lyophilic film.

The optical thickness (a layer thickness $\underline{d}$×refractive index $\underline{n}$) of the transparent layer 19b of the optical interference layer 19 is an integral multiple of ½ of the dominant wavelength (peak wavelength) of light emitted from the EL layer 15. Accordingly, the optical interference layer 19 has a resonant structure. More specifically, when light emitted from the EL layer 15 and, more particularly, light in the wavelength range near the dominant wavelength enters the optical interference layer 19, a light component having the dominant wavelength resonates by repeating reflection between the reflecting layer 19a and the half-reflecting layer 19c. Hence, the intensity of light emerging from the optical interference layer 19 increases. On the other hand, even when interference occurs while, of external light that enters the optical interference layer 19, a light component except the resonant dominant wavelength reflects between the reflecting layer 19a and the half-reflecting layer 19c, the phase does not coincide with the optical path length by the optical thickness of the transparent layer 19b. Since the light is gradually attenuated, it rarely emerges outside from the optical interference layer 19. The optical interference layer 19 can amplify the light emitted from the EL layer 15 and output light in a relatively wide wavelength range as light in a narrower wavelength range. Hence, the color purity of each color can be increased. In addition, glare caused by internal reflection of external light can be suppressed. For this reason, dark display or black display can be executed, and therefore, the contrast ratio can be increased. The optical thickness of the transparent layer 19b is preferably changed depending on the wavelength range of the color of emitted light of each pixel. When the pixels should emit light of R (red), G (green) having a shorter wavelength than red, and B (blue) having a shorter wavelength than green, the optical thicknesses are set to satisfy optical thickness of transparent layer 19b of pixel R>optical thickness of transparent layer 19b of pixel G>optical thickness of transparent layer 19b of pixel B.

The liquid-repellent film 14 (e.g., a fluoroplastic film or a reactive silicon film) having a characteristic (to be referred to as "liquid repellency" hereinafter) representing that the film surface repels a liquid and wets with it at a contact angle of 50° or more is formed on the optical interference layer 19 around each EL layer 15. When the liquid-repellent film 14 is formed into a mesh shape between the EL layers 15 when viewed from the upper side, a plurality of surrounded regions surrounded by the liquid-repellent film 14 are arrayed in a matrix, and the EL layers 15 are formed in the surrounded regions. As shown in FIG. 4, part of the liquid-repellent film 14 may overlap part of the edge of the pixel electrode 16. However, they need not always overlap. Especially, the EL layer 15 is formed as a very thin film. When the EL layer 15 is formed by wet film formation, and the organic compound containing liquid one-sidedly flows to adjacent pixels, some pixels obtain thin EL layers 15. This may cause short circuit between the pixel electrode 16 and the counter transparent electrode 13. However, the liquid-repellent film 14 which partitions the adjacent pixel electrodes 16 can prevent the organic compound containing liquid from flowing to adjacent pixels. In addition, when adjacent pixels are made of different materials which emit light of different colors, the liquid-repellent film 14 can prevent any decrease in purity of the color of emitted light of each pixel, which may be caused when the organic compound containing liquids of the adjacent pixels mix each other. The liquid-repellent film 14 may have a structure in which a material layer made of a resin or the like, which does not exhibit liquid repellency, is used as a dam that stores the organic compound containing liquid for each pixel, and a layer having liquid repellency may be formed on the exposed surface of the material layer. When the EL layer 15 is formed by epitaxial growth, the liquid-repellent film 14 need not be formed.

The counter transparent electrode 13 is formed as one common electrode of the organic EL elements $E_{1,1}$ to $E_{m,n}$ of all the pixels $P_{1,1}$ to $P_{m,n}$. The counter transparent electrode 13 is formed on the entire surface of the display unit 7 when viewed from the upper side and has a multilayered structure having an electron injection layer 13$a$ and a transparent conductive layer 13$b$ sequentially formed from the side of the EL layers 15. The electron injection layer 13$a$ is so thin as to pass light and is made of a material having a relatively low work function (e.g., magnesium, calcium, lithium, barium, a single metal including a rare earth metal, or an alloy containing at least one of these single substances). The electron injection layer 13$a$ has a thickness less than the visible light wavelength range and is 10 to 200 nm. The transparent conductive layer 13$b$ is conductive and transparent to visible light. The transparent conductive layer 13$b$ is made of, e.g., indium oxide, zinc oxide, or tin oxide, or a mixture containing at least one of them (e.g., indium tin oxide (ITO), indium zinc oxide, or cadmium tin oxide (CTO)). The resistivity of such a material is about $100 \times 10^{-6}$ Ωcm to $1,000 \times 10^{-6}$ Ωcm. The transparent conductive layer 13$b$ is preferably thin to increase the light transmittance of the counter transparent electrode 13. The thickness of the transparent conductive layer 13$b$ is 50 to 1,000 nm. As described above, the counter transparent electrode 13 passes at least part of the light emission wavelength range of the EL layer 15. The display apparatus 1 has a so-called top emission structure which outputs light from the EL layer 15 from the side of the counter transparent electrode 13.

The counter transparent electrode 13 may be divided into two or more parts. The counter transparent electrode 13 may include a plurality of stripe-shaped electrodes which are commonly connected to pixels adjacent in the column direction. Alternatively, the counter transparent electrode 13 may include a plurality of stripe-shaped electrodes which are commonly connected to pixels adjacent in the row direction. A plurality of insulating protective layers 41 are formed on the counter transparent electrode 13 almost in correspondence with the regions where the EL layers 15 are formed. The plurality of insulating protective layers 41 are arrayed in a matrix independently for each pixel when viewed from the upper side, like the EL layers 15. The insulating protective layer 41 is transparent and is made of, e.g., an inorganic silicide such as silicon oxide ($SiO_2$) or silicon nitride (SiN) or an organic resin such as polyimide.

A conductive auxiliary electrode layer 42 is formed in each non-display region located between edge portions 41$a$ of the insulating protective layer 41 in the display unit 7. Between the insulating protective layers 41, the auxiliary electrode layer 42 is in direct contact with the transparent conductive layer 13$b$. The auxiliary electrode layer 42 is formed into a mesh shape while substantially overlapping the entire region between the plurality of pixel electrodes 16 when viewed from the upper side. The insulating protective layer 41, EL layer 15, pixel electrode 16, and optical interference layer 19 are arranged in the region in each opening portion 42$a$ of the auxiliary electrode layer 42. An edge portion 42$b$ of the auxiliary electrode layer 42 can be formed either inside or outside the edge portion of the counter transparent electrode 13. To reduce the sheet resistance, the occupation area of the auxiliary electrode layer 42 is preferably close to the entire non-display region in the display unit 7 as much as possible. The edge portion 41$a$ of the insulating protective layer 41 extends outside the opening portion 42$a$ of the auxiliary electrode layer 42. Hence, in patterning the auxiliary electrode layer 42 by etching, the insulating protective layer 41 can protect the transparent conductive layer 13$b$ from the etchant. The auxiliary electrode layer 42 is located to overlap the first transistor 8, second transistor 9, and third transistor 10 when viewed from the upper side.

The auxiliary electrode layer 42 functions as an electrode integrated with the counter transparent electrode 13 and decreases the sheet resistance as compared to the single counter transparent electrode 13. The auxiliary electrode layer 42 is made of a material which has a lower resistivity than the material of the transparent conductive layer 13$b$ and is hardly oxidized. From this viewpoint, copper (resistivity: $1.67 \times 10^{-6}$ Ωcm), silver (resistivity: $1.59 \times 10^{-6}$ Ωcm), gold (resistivity: $2.35 \times 10^{-6}$ Ωcm), platinum (resistivity: $10.6 \times 10^{-6}$ Ωcm), aluminum (resistivity: $2.66 \times 10^{-6}$ Ωcm), or chromium (resistivity: $12.9 \times 10^{-6}$ Ωcm), or an alloy containing at least one of them is preferably used. In addition, the auxiliary electrode layer 42 is located to overlap the positions of the selection scan lines $X_1, X_2, \ldots, X_m$, current lines $Y_1, Y_2, \ldots, Y_n$, and voltage source scan lines $Z_1, Z_2, \ldots, Z_m$ connected to the first transistors 8, second transistors 9, and third transistors 10 when viewed from the upper side. When a light-shielding material having a low reflectance is used, the auxiliary electrode layer 42 can be used as a light-shielding film (black mask) between the pixels. The thickness of the auxiliary electrode layer 42 is preferably about 10 to 1,000 nm and, to obtain a larger light-shielding effect, preferably 50 nm or more. If the selection scan lines $X_1, X_2, \ldots, X_m$, current lines $Y_1, Y_2, \ldots, Y_n$, or voltage source scan lines $Z_1, Z_2, \ldots, Z_m$ are wiring lines made of a conductive material having a reflectance, and the optical interference layer 19 does not overlap the wiring lines made of the conductive material having a reflectance, or if at least the selection scan lines $X_1, X_2, \ldots, X_m$, current lines $Y_1, Y_2, \ldots, Y_n$, or voltage source scan lines $Z_1, Z_2, \ldots, Z_m$ are wiring lines made of a conductive material having a reflectance, and the display apparatus 1 has no optical interference layer 19, the auxiliary electrode layer 42 can suppress reflection by external light in the wiring lines made of the conductive material having a reflectance. Hence, the visibility can be increased. In this case, more specifically, the auxiliary electrode layer 42 preferably contains at least one of chromium, chromium oxide, a chromium alloy, nickel-tantalum alloy, nickel-copper alloy, and any other nickel alloy. The luster of the auxiliary electrode layer 42 may be eliminated to obtain a lower reflectance by forming a very small three-dimensional pattern on its surface. When the transparent conductive layer 13b is not formed, the auxiliary electrode layer 42 may come into direct contact with a part of the electron injection layer 13a between the insulating protective layers 41. When the electron injection layer 13a is not formed, the auxiliary electrode layer 42 may come into direct contact with the counter transparent electrode 13 including only the transparent conductive layer 13b between the insulating protective layers 41. As described above, the auxiliary electrode layer 42 is formed around the pixel $P_{i,j}$. Hence, the auxiliary electrode layer 42 can be deposited thick enough to be opaque. For this reason, the sheet resistance can greatly be reduced.

Since the auxiliary electrode layer 42 is made of a material having a lower resistivity than the transparent conductive layer 13b, the sheet resistance of the electrode on the upper side of the EL layer 15 can be reduced. In addition, the auxiliary electrode layer 42 does not overlap the portion of the transparent conductive layer 13b, which is located in the display region. For this reason, light from the EL layer 15 can pass the portion of the transparent conductive layer 13b, which is located in the display region, and be output without being shielded by the auxiliary electrode layer 42.

If there is no auxiliary electrode layer 42, the voltage in the counter transparent electrode 13 is attenuated in a pixel far apart from the wiring source, which outputs the reference potential $V_{SS}$ to the counter transparent electrode 13, as compared to a pixel close to the wiring source because the sheet resistance of the counter transparent electrode 13 is high. This makes the current density nonuniform and generates a variation in light emission luminance in the plane. However, when the auxiliary electrode layer 42 is used, the sheet resistance of the electrode of each organic EL element can be reduced. Hence, the density of current flowing to the counter transparent electrodes 13 of the pixels can be made constant without reducing the transmittance, and uniform light emission can be caused in the display unit 7.

A light-shielding film 44 is formed on the auxiliary electrode layer 42, i.e., in a non-display region. The light-shielding film 44 is formed in a matrix when viewed from the upper side, like the auxiliary electrode layer 42, and overlaps the auxiliary electrode layer 42. The light-shielding film 44 itself need not be conductive but has a light-shielding effect and low reflectance. The light-shielding film 44 is located to overlap the auxiliary electrode layer 42 which overlaps the first transistors 8, second transistors 9, third transistors 10, selection scan lines $X_1, X_2, \ldots, X_m$, current lines $Y_1, Y_2, \ldots, Y_n$, and voltage source scan lines $Z_1, Z_2, \ldots, Z_m$ when viewed from the upper side. Hence, the structure of the light-shielding film 44 can suppress light reflection by these components and make reflected light almost invisible. The light-shielding film 44 can be made of a material prepared by, e.g., dispersing a black pigment having a light-shielding effect and low reflectance, such as carbon black, in a matrix (binder) such as a resin. Alternatively, the light-shielding film 44 may be made of a resin having a light-shielding effect and low reflectance or a metal such as chromium oxide. In this case, the auxiliary electrode layer 42 itself need not have the light-shielding effect and low reflectance, or the auxiliary electrode layer 42 itself may have the light-shielding effect and low reflectance.

The insulating protective layers 41 and light-shielding film 44 are covered with a sealing film 43. The sealing film 43 is formed over the entire upper surface of the substrate 12. The sealing film 43 cancels steps generated between the insulating protective layers 41 and the auxiliary electrode layer 42. The sealing film 43 has an almost flat upper surface. The sealing film 43 has a characteristic that passes light and is made of a transparent resin (e.g., methacrylic resin, acrylic resin, or epoxy resin).

The pixel electrodes 16 do not overlap the selection scan lines $X_1$ to $X_m$, current lines $Y_1$ to $Y_n$, and voltage source scan lines $Z_1$ to $Z_m$ when viewed from the upper side to suppress any delay of the current flowing to the wiring lines caused by the parasitic capacitance between the pixel electrodes 16 and the wiring lines. However, if the insulating planarization film 18 is so thick as to sufficiently relax the parasitic capacitance, the pixel electrodes 16 may overlap the wiring lines. Accordingly, the EL layers 15 on the pixel electrodes 16 can also be made large. Hence, the display area can be increased, or the display area ratio in the display unit 7 can be made high.

The upper portion of the sealing film 43 may hermetically be sealed by a glass substrate, as needed.

The pixel driving circuits $D_{1,1}$ to $D_{m,n}$ of the display apparatus 1 are of a current gray level type which displays multiple gray levels by controlling the value of the signal current flowing to one of the third transistors 10, as will be described later. However, the present invention is not limited to this. The pixel driving circuits may be of a voltage gray level type which displays multiple gray levels by controlling the voltage value of the signal voltage applied to the pixel driving circuits $D_{1,1}$ to $D_{m,n}$.

A method of manufacturing the display apparatus 1 will be described next.

(1) Array Substrate Manufacturing Step

Figure 7A:
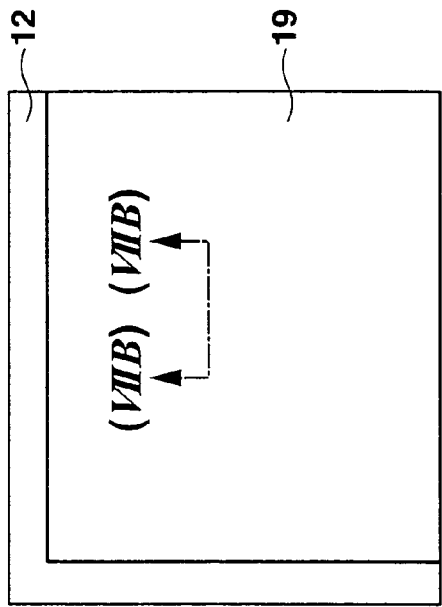
FIG. 7A is a view showing a step in manufacturing the display apparatus.
Figure 7B:
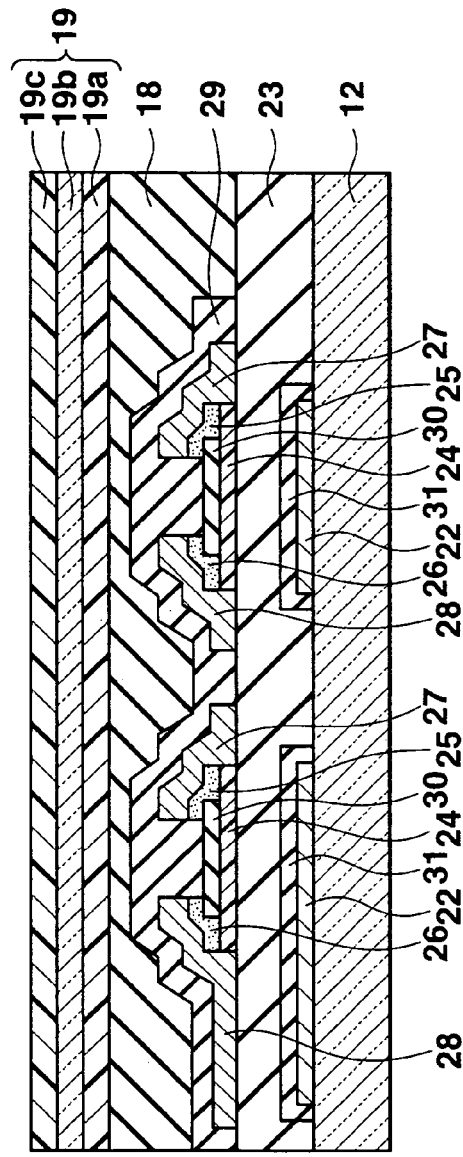
FIG. 7B is a sectional view taken along a line (VIIB)-(VIIB) in FIG. 7A.

As shown in FIGS. 7A and 7B, the first transistor 8, second transistor 9, and third transistor 10 of each pixel are formed on the display unit 7 of the flat substrate 12. In addition, the selection scan lines $X_1, X_2, \ldots, X_m$, current lines $Y_1, Y_2, \ldots, Y_n$, and voltage source scan lines $Z_1, Z_2, \ldots, Z_m$ are formed. After that, the transistors 8 to 10 and the wiring lines $X_1$ to $X_m$, $Y_1$ to $Y_n$, and $Z_1$ to $Z_m$ are selectively covered with the protective insulating film 29 made of silicon nitride or silicon oxide. The insulating planarization film 18 made of a resin such as polyimide is deposited on the protective insulating film 29 in correspondence with the entire region of the display unit 7. Then, the reflecting layer 19a, transparent layer 19b, and half-reflecting layer 19c are sequentially formed to form the optical interference layer 19.

(2) Opening Portion Formation Step

Figure 8A:
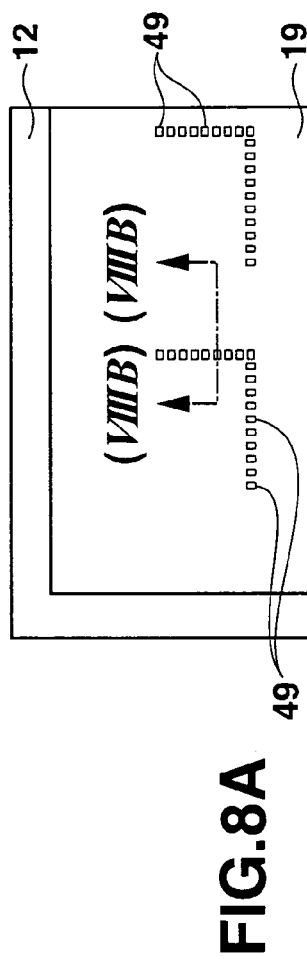
FIG. 8A is a view showing a step following FIG. 7A.
Figure 8B:
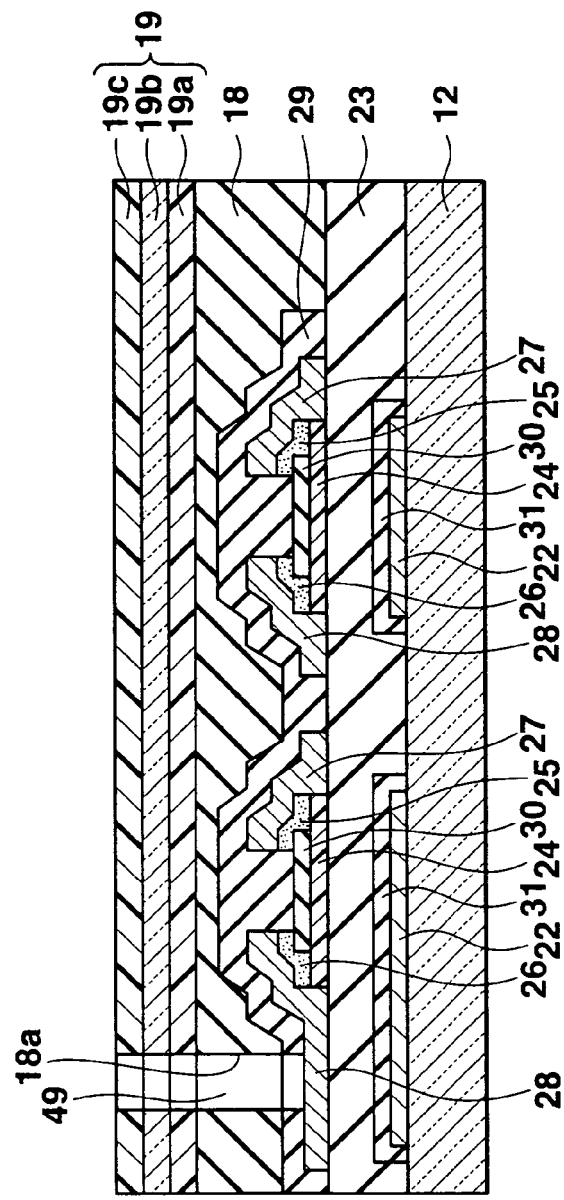
FIG. 8B is a sectional view taken along a line (VIIIB)-(VIIIB) in FIG. 8A.

As shown in FIGS. 8A and 8B, the contact hole 49 which communicates with the source electrode layer 28 of the third transistor 10 of each pixel are formed in the optical interference layer 19, insulating planarization film 18, and protective insulating film 29 by photolithography. An opening portion 18a of the insulating planarization film 18 forms part of the contact hole 49. When the height of the insulating planarization film 18 is more than the thickness of the pixel electrode 16, the opening portion 18a may be filled with a conductive material before formation of the pixel electrodes 16.

(3) Pixel Electrode Array Formation Step

Figure 9A:
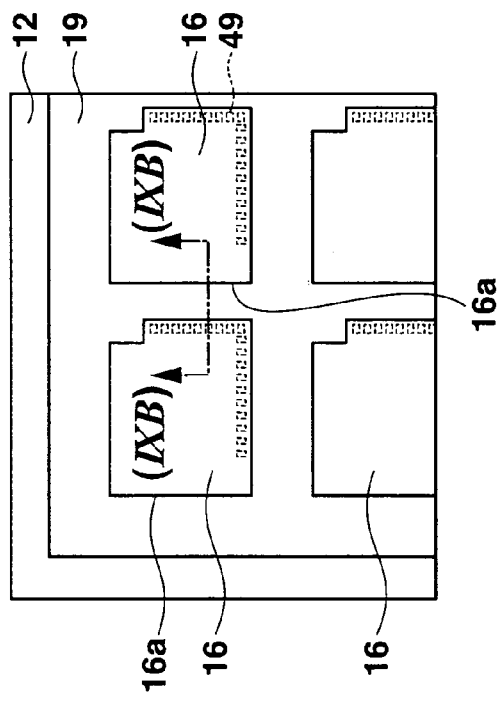
FIG. 9A is a view showing a step following FIG. 8A.
Figure 9B:
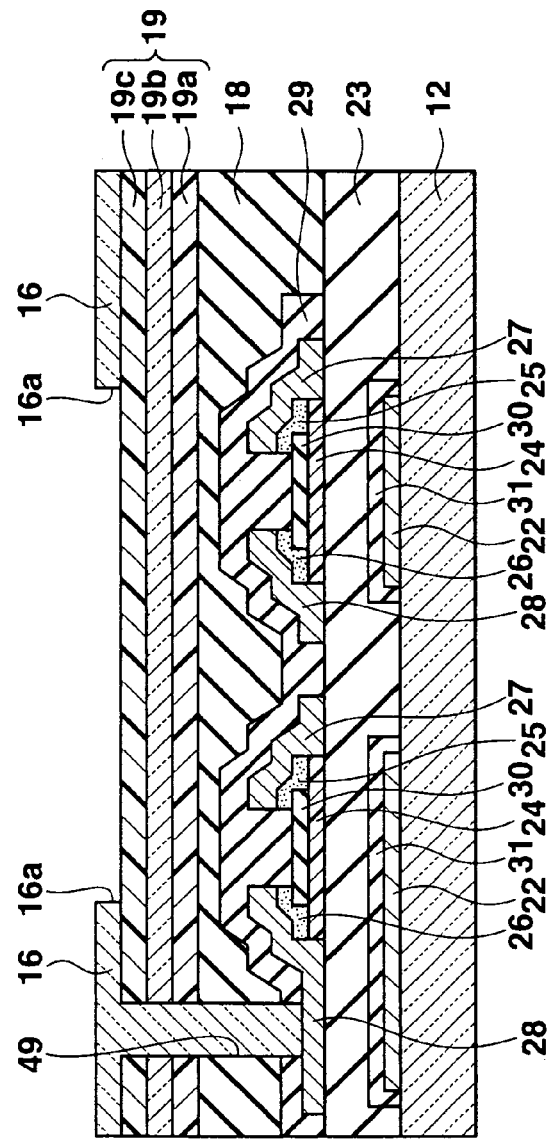
FIG. 9B is a sectional view taken along a line (IXB)-(IXB) in FIG. 9A.

As shown in FIGS. 9A and 9B, a transparent conductive film (e.g., an ITO film) is formed on the entire surface of the optical interference layer 19 by epitaxial growth. A resist is formed in a matrix on the conductive film by the photoresist process. The conductive film is processed by etching or the like by using the resist as a mask. After that, the resist is removed. The remaining conductive film becomes the pixel electrode 16 which is electrically connected to the source electrode layer 28 of the third transistor 10 through the contact holes 49. The plurality of pixel electrodes 16 can be patterned in a matrix. Each of the plurality of pixel electrodes 16 is arranged in a corresponding display region surrounded by the first transistor 8, second transistor 9, and third transistor 10 of each pixel. The pixel electrodes 16 are also electrically isolated from each other. The edge portion 16a has been formed along the first transistor 8, second transistor 9, and third transistor 10. The pixel electrodes 16 overlap the optical interference layer 19 when viewed from the upper side. If an etchant for the transparent conductive film may erode the optical interference layer 19, an insulating layer having a high etching resistance may be inserted between the optical interference layer 19 and the pixel electrodes 16.

(4) Liquid-Repellent Film Formation Step

Figure 10A:
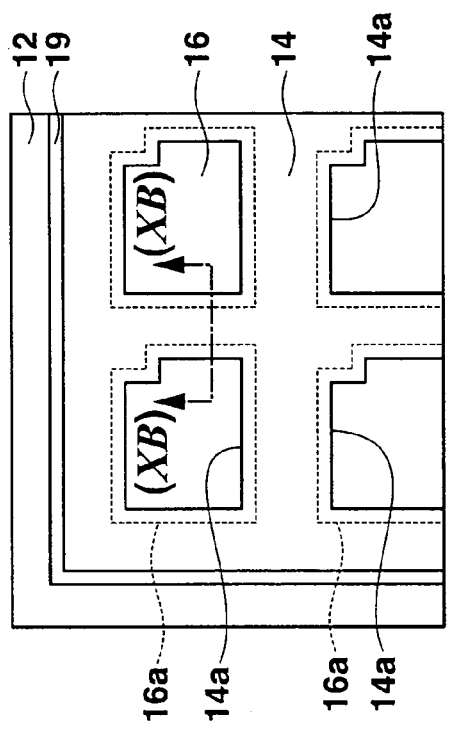
FIG. 10A is a view showing a step following FIG. 9A.
Figure 10B:
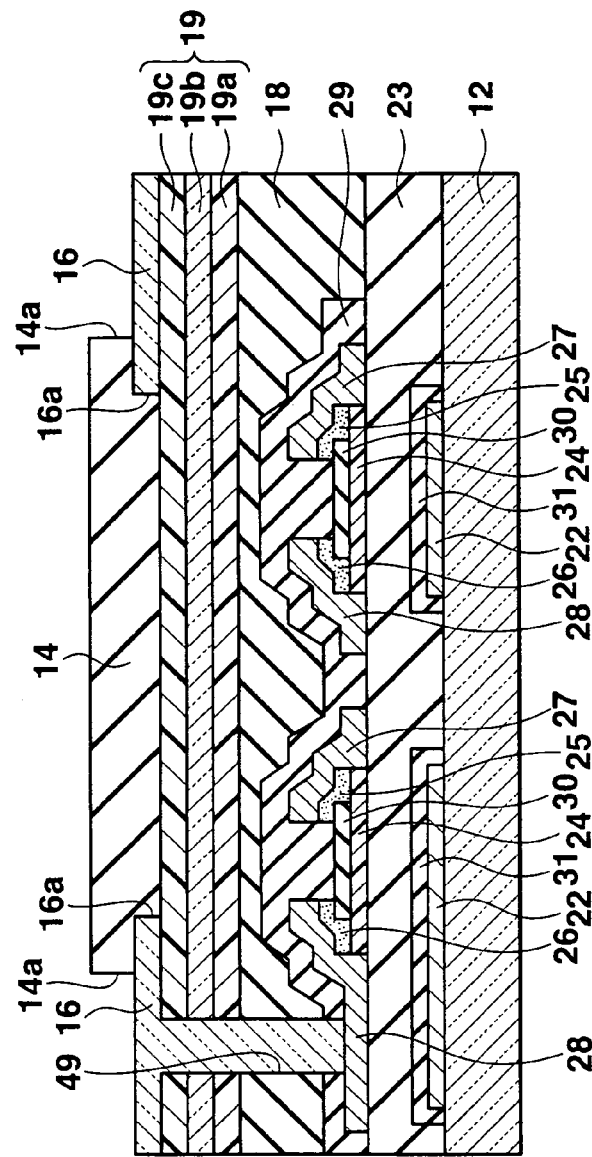
FIG. 10B is a sectional view taken along a line (X)-(X) in FIG. 10A.

As shown in FIGS. 10A and 10B, the liquid-repellent film 14 having the opening portions 14a to which the central portions of the pixel electrodes 16 are exposed is formed into a mesh shape on the display unit 7. At this time, the edges which define the opening portion 14a of the liquid-repellent film 14 cover the edge portions 16a of the pixel electrodes 16. The liquid-repellent film 14 may be formed by photolithography and then etching. The liquid-repellent film 14 may be a fluoroplastic film such as a silazane compound which has Si—N—Si bonds and a functional group containing fluorine in which a functional group containing fluorine is bonded to N or/and Si, or a reactive silicon film.

The EL layers 15 may be formed in the following way. The liquid-repellent film 14 is formed on the entire surface of the display unit 7. A photocatalyst which generates an active species that promotes chemical reaction to eliminate the liquid repellency upon receiving light in a predetermined wavelength range is placed on the liquid-repellent film 14 on the upper surface of each pixel electrode 16. The light in the predetermined wavelength range is caused to become incident from the upper surface of the photocatalyst to impart a lyophilic effect to the liquid-repellent film 14 on the pixel electrode 16 where the EL layer 15 should be formed. The EL layer 15 is formed on the liquid-repellent film 14 by a method to be described later. More specifically, a liquid containing silazane compound is applied thin to the entire surface of the display unit 7. After the silazane compound is converted into a polymer, the liquid is dried, and a photocatalyst such as titanium oxide is placed on the pixel electrodes 16. The photocatalyst is selectively irradiated with UV rays to eliminate fluorine or a functional group containing fluorine from the silazane-based polymer on the pixel electrodes 16 to eliminate the liquid repellency of the liquid-repellent film 14. The liquid repellency of the liquid-repellent film 14 located between the pixel electrodes 16 may be maintained without irradiating it with UV rays. The liquid-repellent film 14 having no liquid repellency is an insulating film. However, the liquid-repellent film 14 formed on the pixel electrode 16 does not so greatly impede injection of carriers such as holes or electrons because the liquid-repellent film 14 is very thin. The liquid-repellent film 14 may be formed as a base which is made of polyimide and has the opening portion 14a as a sidewall, and a liquid-repellent material such as a fluorine-based material may be applied thin to the surface of the base.

(5) EL Layer Formation Step

Figure 11A:
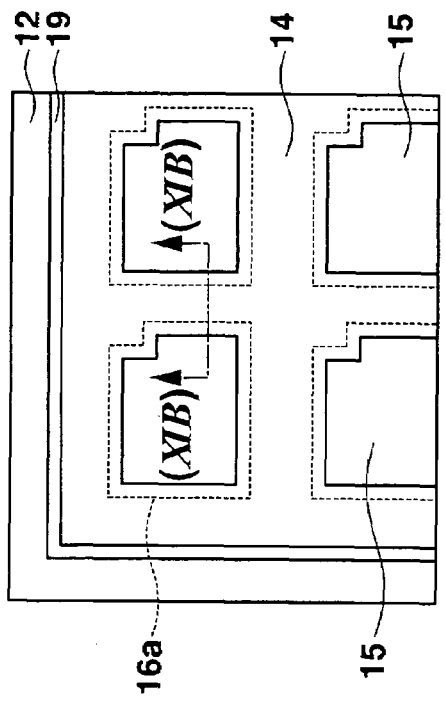
FIG. 11A is a view showing a step following FIG. 10A.
Figure 11B:
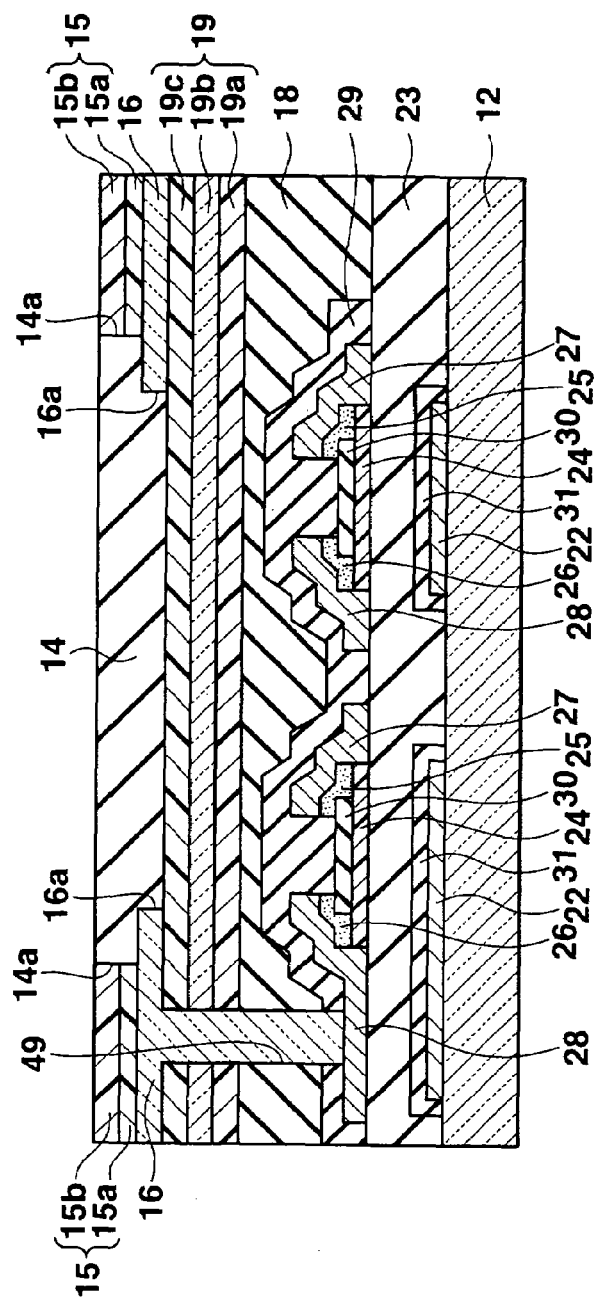
FIG. 11B is a sectional view taken along a line (XI)-(XI) in FIG. 11A.

As shown in FIGS. 11A and 11B, the EL layers 15 are formed on the pixel electrodes 16 exposed by the opening portions 14a of the liquid-repellent film 14. In patterning the EL layers 15, they may selectively be deposited by using a droplet ejection nozzle (inkjet nozzle) which ejects a liquid containing the material of the EL layers 15. More specifically, the nozzle is made to oppose the substrate 12 placed on a stage. The nozzle is moved parallel to the substrate 12, and when the nozzle is located on a surrounded region, it ejects the organic compound containing liquid. Accordingly, the EL layers 15 can be formed to overlap the pixel electrodes 16 when viewed from the upper side.

When the EL layer 15 includes the hole transport layer 15a and light-emitting layer 15b, a nozzle for the hole transport layer first ejects a liquid containing the material of the hole transport layer 15a as a droplet to each region surrounded by the opening portion 14a of the liquid-repellent film 14. After the liquid dries, and the hole transport layer 15a is formed, a nozzle for the light-emitting layer 15b of narrow sense ejects a liquid containing the material of the light-emitting layer 15b as a droplet to each region surrounded by the opening portion 14a of the liquid-repellent film 14. The liquid dries, and the light-emitting layer 15b is formed. Even when the droplet containing the material of the hole transport layer 15a or light-emitting layer 15b drops to the edge of the liquid-repellent film 14, the droplet is repelled by the liquid-repellent film 14 and falls into the opening portion (pixel electrode 16) surrounded by the liquid-repellent film 14. If the liquid-repellent film 14 can sufficiently repel the droplet, the EL layers 15 may be formed by printing. At this time, the liquid-repellent film 14 partitions the liquid containing the material of the EL layers 15 between adjacent pixels even when the accuracy of the printing technique is not so high as photolithography. Hence, pixels with a fine pitch can be formed.

A metal mask having a mesh shape may be formed over the substrate 12 while exposing the pixel electrodes 16. The EL layers 15 may be formed in a matrix by executing epitaxial growth in this state. If the hole transport layers 15a of the pixels can be made of the same material regardless of the colors of light emitted by the EL layers 15, the display unit 7 may wholly be dipped in a liquid containing the material of the hole transport layer 15a. Accordingly, the EL layers 15 can selectively be formed on the pixel electrodes 16 by the patterned liquid-repellent film 14. Instead of forming the liquid-repellent film 14, the hole transport layer 15a may be formed as a continuous layers across the pixels by wholly dipping the display unit 7 in the liquid containing the material of the hole transport layer 15a.

(6) Counter Transparent Electrode Formation Step

Figure 12A:
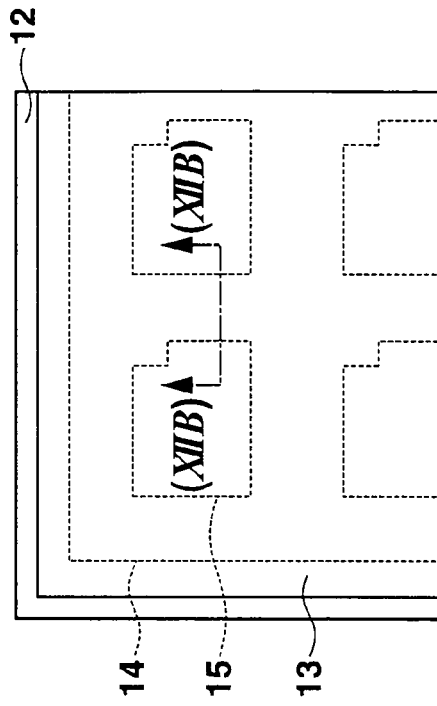
FIG. 12A is a view showing a step following FIG. 11A.
Figure 12B:
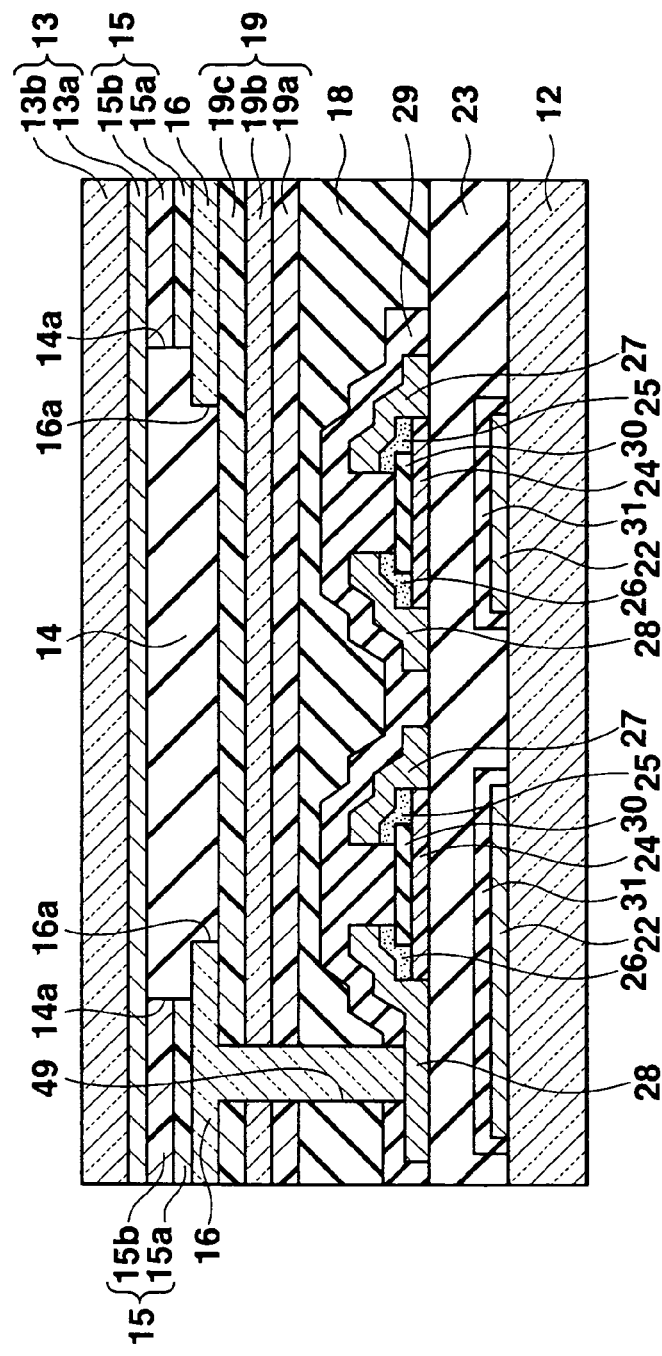
FIG. 12B is a sectional view taken along a line (XII)-(XII) in FIG. 12A.

As shown in FIGS. 12A and 12B, a layer made of magnesium, calcium, lithium, barium, a single metal including a rare earth metal, or an alloy containing at least one of these single substances is formed over the entire surface of the display unit 7 (on the layers 14 and 15) to a thickness of 10 to 200 nm by sputtering or deposition in an inert gas atmosphere such as argon or in a reduced pressure atmosphere at 1 Torr or less, thereby forming the electron injection layer 13a. Subsequently, a material selected from indium tin oxide (ITO), indium zinc oxide, and cadmium tin oxide (CTO) is formed on the entire surface of the formed layer 13a to a thickness of 50 to 200 nm by sputtering or deposition such as CVD, thereby forming the transparent conductive layer 13b on the electron injection layer 13a.

(7) Insulating Protective Layer Array Formation Step

As shown in FIGS. 13A and 13B, epitaxial growth, photoresist process, etching, and resist removal are sequentially executed to pattern the plurality of transparent insulating protective layers 41 in a matrix. The insulating protective layers 41 are formed to overlap the EL layers 15 when viewed from the upper side. The insulating protective layer 41 has a high transmittance to visible light and is made of an inorganic silicide such as silicon oxide or silicon nitride or an organic resin such as polyimide. When the insulating protective layers 41 are made of an organic resin, they may directly be patterned in a matrix by using a droplet ejection technique (inkjet technique) instead of sequentially executing epitaxial growth, photoresist process, etching, and resist removal.

(8) Auxiliary Electrode Layer Formation Step

Figure 14A:
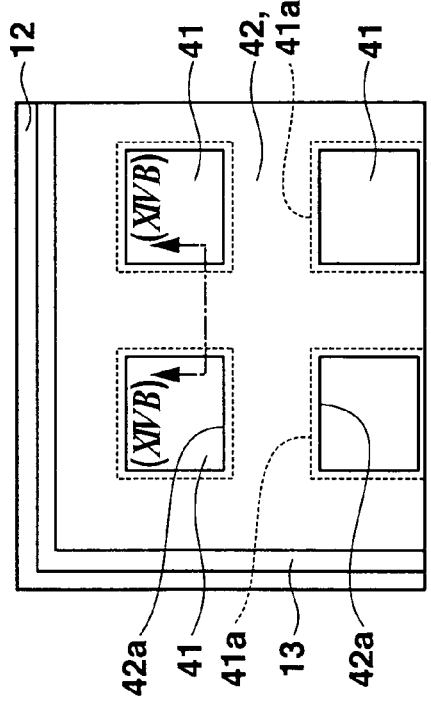
FIG. 14A is a view showing a step following FIG. 13A.
Figure 14B:
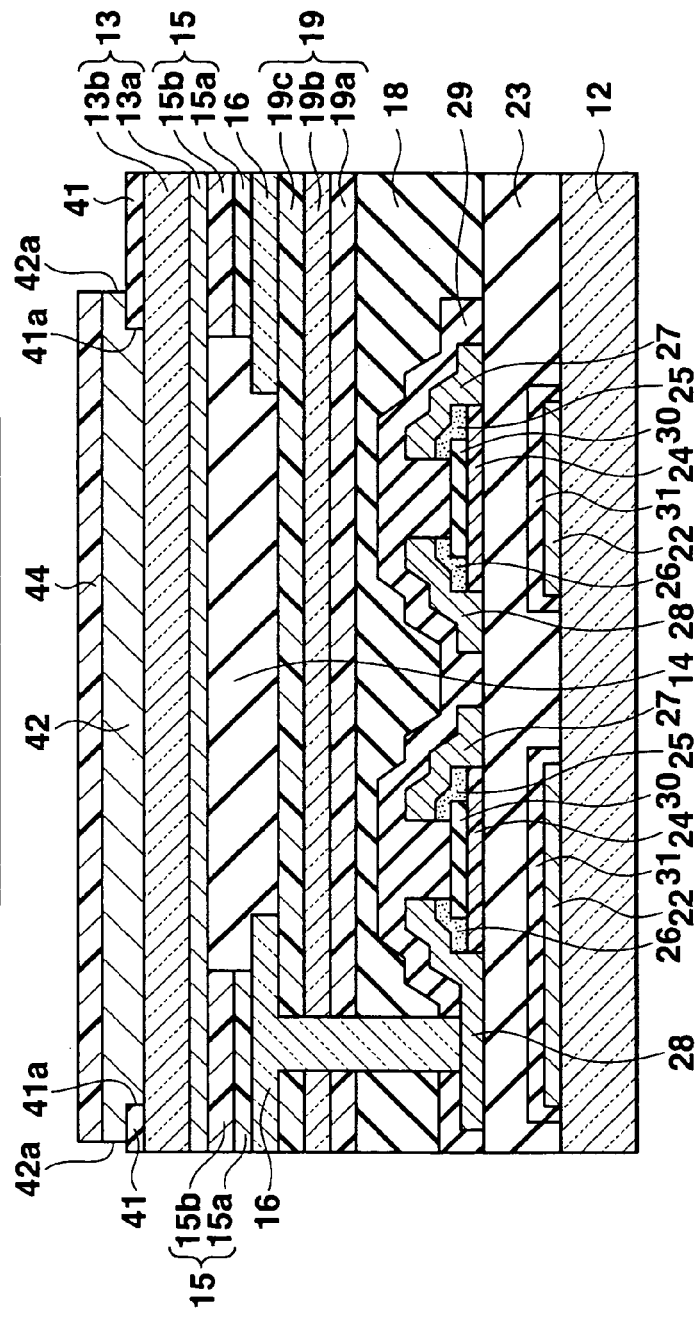
FIG. 14B is a sectional view taken along a line (XIVB)-(XIVB) in FIG. 14A.

As shown in FIGS. 14A and 14B, a conductive film having a light-shielding effect, which is made of e.g., copper, silver, gold, platinum, aluminum, chromium, and an alloy containing at least one of them, is formed on the counter transparent electrode 13 by epitaxial growth such as sputtering. In addition, a light-shielding resin prepared by dispersing carbon black in a resin or a light-shielding metal such as chromium oxide is formed on the formed conductive film and then patterned at once by etching by photolithography to form the auxiliary electrode layer 42 and the light-shielding film 44 on it. The auxiliary electrode layer 42 preferably has a resistivity of $50.0 \times 10^{-6}$ Ωcm or less and a thickness of about 10 to 1,000 nm. The insulating protective layer 41, EL layer 15, pixel electrode 16, and optical interference layer 19 are arranged in the region in each opening portion 42a of the auxiliary electrode layer 42. The edge portion 41a of the insulating protective layer 41 extends outside the opening portion 42a of the auxiliary electrode layer 42. Hence, in patterning the auxiliary electrode layer 42 by etching, the insulating protective layer 41 can protect the transparent conductive layer 13b from the etchant. The electron injection layer 13a which is relatively easily oxidized is also covered with the insulating protective layer 41 and transparent conductive layer 13b. Hence, even when one of the insulating protective layer 41 and transparent conductive layer 13b has any pinhole, the other layer protects the electron injection layer 13a so that it can be prevented from being oxidized by the etchant. In addition, the auxiliary electrode layer 42 and light-shielding film 44 have a shape that overlaps the first transistors 8, second transistors 9, third transistors 10, selection scan lines $X_1, X_2, \ldots, X_m$, current lines $Y_1, Y_2, \ldots, Y_n$, and voltage source scan lines $Z_1, Z_2, \ldots, Z_m$ when viewed from the upper side. When the light-shielding film 44 is to be formed by oxidizing the conductive material (e.g., chromium) of the auxiliary electrode layer 42, the light-shielding film 44 may be formed by forming the auxiliary electrode layer 42 and oxidizing its upper surface portion. The thickness of the conductive material formed at this time includes in advance the portion to be oxidized for the light-shielding film 44. When the conductive film is a chromium film, wet etching may be executed by using, as an etchant, a solution mixture containing ceric ammonium nitrate and perchloric acid.

(9) Step of Forming Sealing Film

Figure 15A:
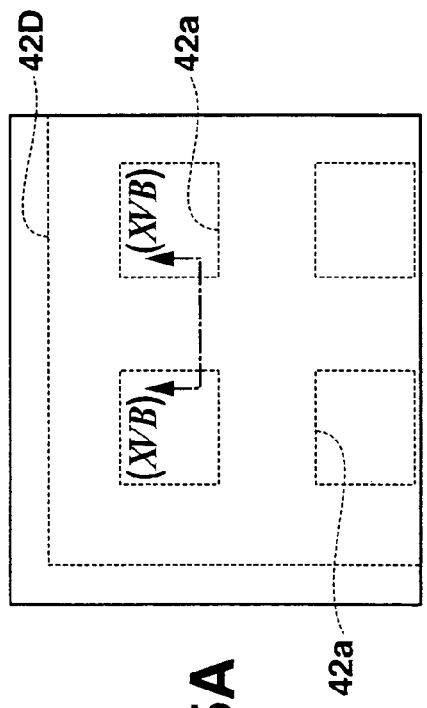
FIG. 15A is a view showing a step following FIG. 14A.
Figure 15B:
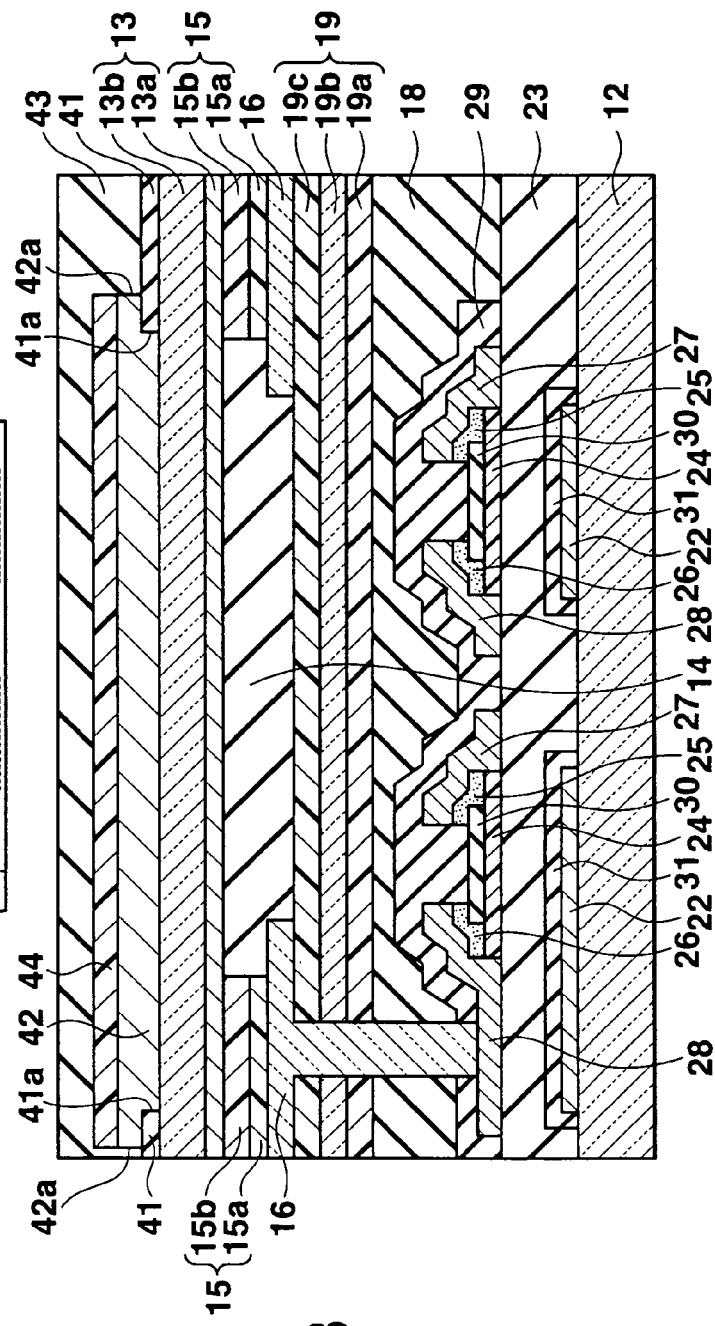
FIG. 15B is a sectional view taken along a line (XVB)-(XVB) in FIG. 15A.

As shown in FIGS. 15A and 15B, the sealing film 43 prepared by inserting thin metal films and inorganic compound layers between a plurality of resin films is formed over the entire display unit 7. At this time, the sealing film 43 preferably covers all the components in the display unit 7 as much as possible, except components extending outside the region of the display unit 7, such as the terminals of the selection scan lines $X_1$ to $X_m$, current lines $Y_1$ to $Y_n$, and voltage source scan lines $Z_1$ to $Z_m$ and the terminals of the counter transparent electrode 13 of the organic EL elements $E_{1,1}$ to $E_{m,n}$. To smoothen the surface of the sealing film 43 to efficiently output light from the EL layers 15, the surface of the sealing film 43 may be subjected to chemical polishing, mechanical polishing, or chemical mechanical polishing. In addition, a counter substrate opposing the substrate 12 may be arranged above the sealing film 43 to arrange the display unit 7 between the substrates.

In the display apparatus manufactured in the above way, the selection scan driver 3, voltage source driver 4, and data driver 5 control the pixel driving circuits $D_{1,1}$ to $D_{m,n}$ of the pixels $P_{1,1}$ to $P_{m,n}$ through the selection scan lines $X_1$ to $X_m$, current lines $Y_1$ to $Y_n$, and voltage source scan lines $Z_1$ to $Z_m$ to cause the organic EL elements $E_{1,1}$ to $E_{m,n}$ to appropriately emit light so that the light emerges outside from the side of the counter transparent electrode 13. Hence, the display surface is formed on the side of the counter transparent electrode 13. A user who opposes the side of the counter transparent electrode 13 can see the displayed contents.

As described above, in this embodiment, the auxiliary electrode layer 42 having a mesh shape is formed directly on the counter transparent electrode 13 while overlapping the non-display regions between the plurality of pixel electrodes 16. For this reason, even when the counter transparent electrode 13 is made of, e.g., a metal oxide material having a relatively high resistivity, the sheet resistance of the entire electrode can be reduced to make a current easily flow while the decrease of the aperture ratio is minimized. In addition, since the low resistive auxiliary electrode layer 42 arranged on the entire region of the counter transparent electrode 13, the applied voltage on a side of the counter transparent electrode 13 can be uniformed in the plane. Even if the same potential is applied to all the pixel electrodes 16, the value of the flowing current becomes uniform. All the EL layers 15 can emit light almost at the same intensity, and the light emission intensity in the plane can be uniformed.

Furthermore, since the auxiliary electrode layer 42 with a low resistance sufficiently reduces the sheet resistance of the entire electrode, the counter transparent electrode 13 can be made thinner to suppress the degree of attenuation of light emitted from the EL layers 15 in passing through the counter transparent electrode 13. As described above, a bright display screen can be provided even in low-voltage driving. In addition, since any degradation in the EL layers 15 by the applied voltage can be suppressed, the service life of the display apparatus 1 can be prolonged.

Since the auxiliary electrode layer 42 having a light-shielding effect functions as a light-shielding film in the non-display region, the contrast ratio can be increased. In addition, since interference of external light occurs in the optical interference layer 19, the reflectance of external light that becomes incident on the display surface of the display apparatus 1 can be reduced. Even when the display apparatus 1 exists under a bright environment, any decrease in contrast ratio of the display surface can be suppressed. Hence, the display screen of the display apparatus 1 is highly visible for the user.

Modifications will be described below. The display apparatus of each modification has the same arrangement as that of the display apparatus 1 according to the above embodiment except points to specially be mentioned below.

(First Modification)

Figure 16:
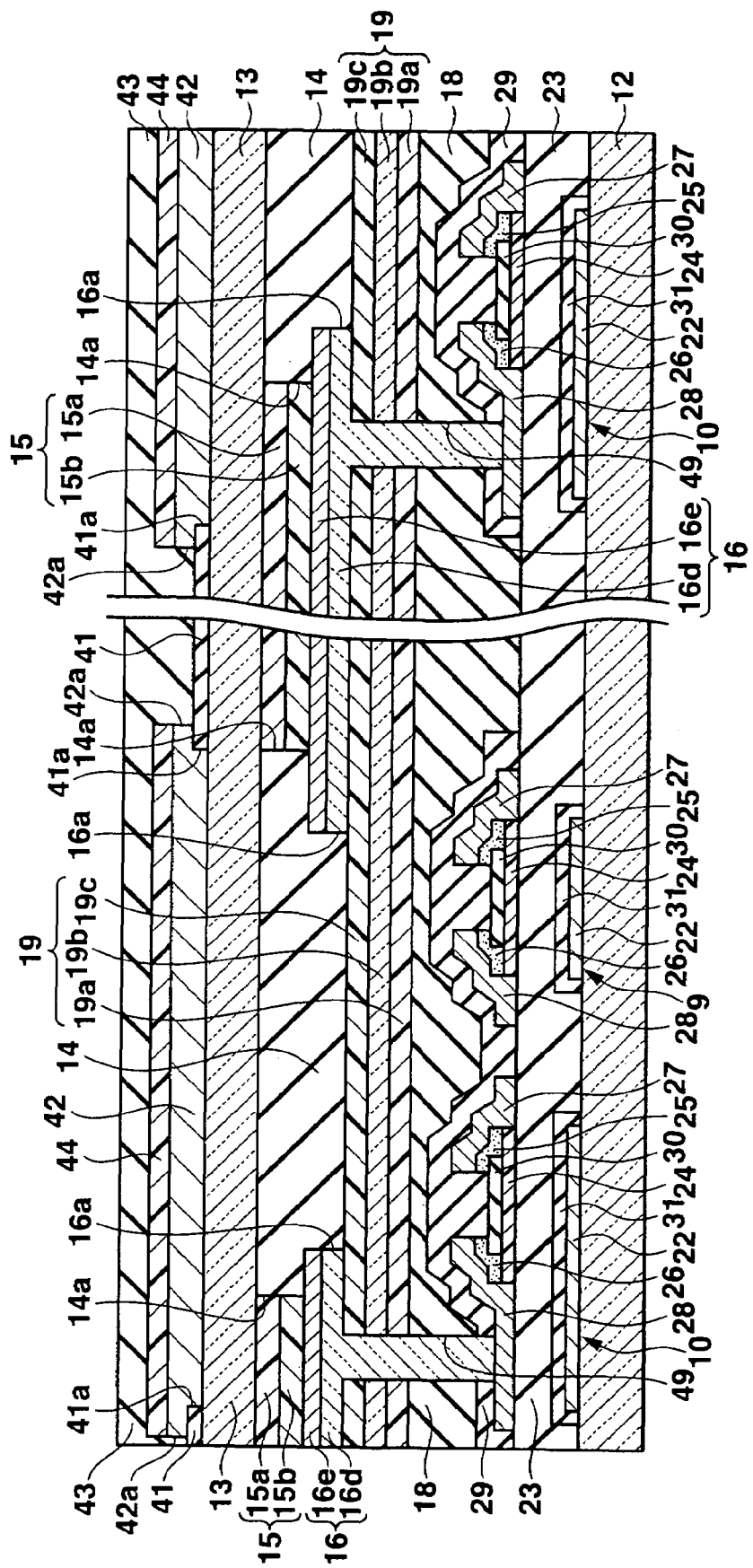
FIG. 16 is a sectional view of another display apparatus to which the present invention is applied as the first modification and which is taken along the line (IV)-(IV) in FIG. 3 in a direction of thickness.

In the above embodiment, each pixel electrode 16 serves as an anode, and the counter transparent electrode 13 serves as a cathode. However, as shown in FIG. 16, each pixel electrode 16 may serve as a cathode, and the counter transparent electrode 13 may serve as an anode. In this case, the pixel electrode 16 has a multilayered structure including a transparent conductive layer 16d and an electron injection layer 16e sequentially formed from the side of the substrate 12. The transparent conductive layer 16d and electron injection layer 16e are formed independently for each pixel and arrayed in a matrix. The characteristic and component of the transparent conductive layer 16d are the same as those of the transparent conductive layer 13b in the above embodiment. The characteristic and component of the electron injection layer 16e are also the same as those of the electron injection layer 13a in the above embodiment. The transparent conductive layer 16d is connected to the source electrode layer 28 of the third transistor 10 through the opening portion 49.

In this case, the counter transparent electrode 13 has a single-layered structure. The single layer is formed solidly on the entire surface. The material composition and characteristic of the counter transparent electrode 13 are the same as those of the pixel electrode 16 of the above embodiment.

In addition, the layer formation order in the EL layer 15 is reverse to that in the above embodiment. More specifically, in the first modification, the EL layer 15 has a multilayered structure including the light-emitting layer 15b and hole transport layer 15a sequentially formed from the side of the pixel electrode 16. The EL layer 15 may have a three-layered structure including an electron transport layer, a light-emitting layer, and a hole transport layer sequentially formed from the side of the pixel electrode 16, a two-layered structure including an electron transport layer and a light-emitting layer sequentially formed, or a single-layered structure including only a light-emitting layer.

Even in the display apparatus of the first modification, the auxiliary electrode layer 42 formed into a mesh shape can increase the density of a current supplied from the counter transparent electrode 13 and uniform the current density in the plane.

(Second Modification)

Figure 17:
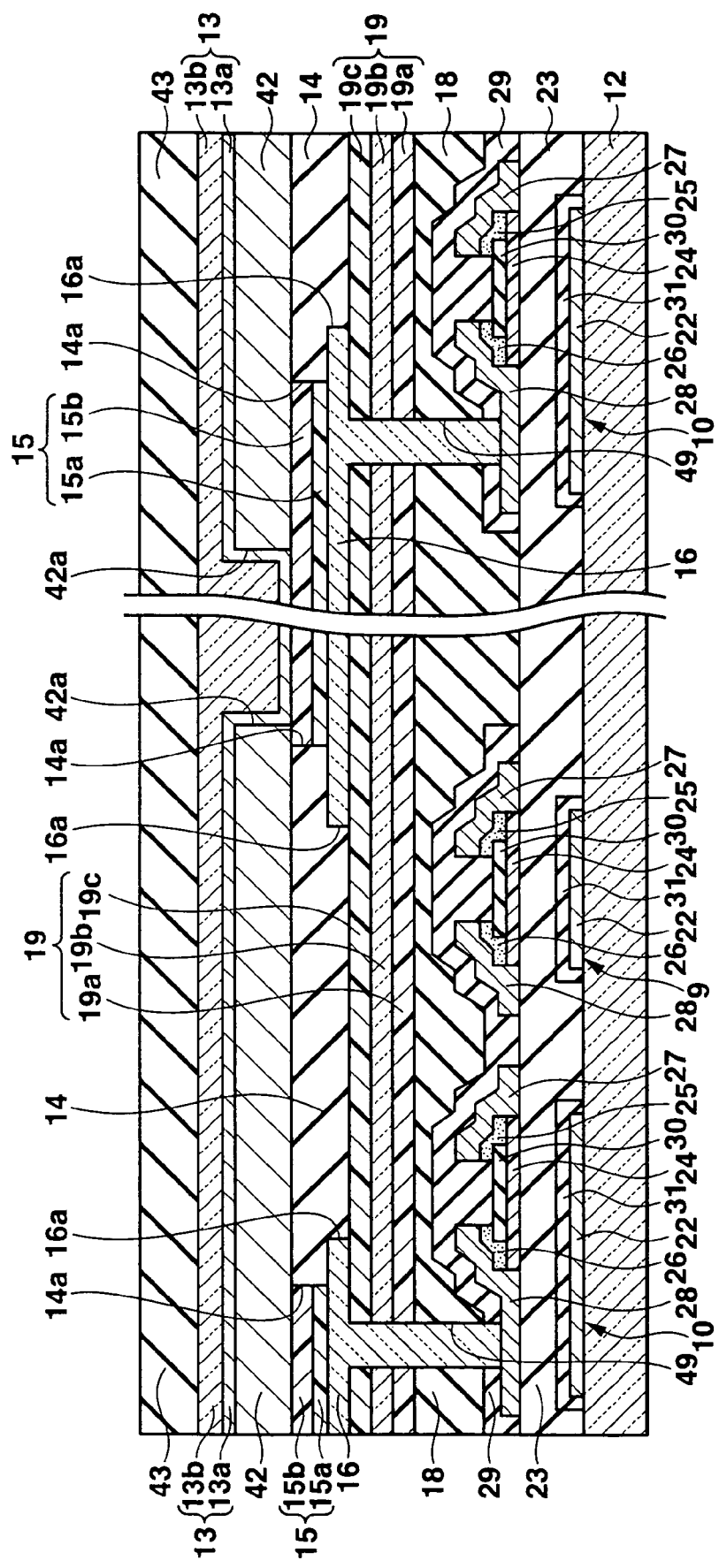
FIG. 17 is a sectional view of still another display apparatus to which the present invention is applied as the second modification and which is taken along the line (IV)-(IV) in FIG. 3 in a direction of thickness.

In the above embodiment, the auxiliary electrode layer 42 is formed on the counter transparent electrode 13. However, as shown in FIG. 17, the auxiliary electrode layer 42 may be arranged under the counter transparent electrode 13. The position of the auxiliary electrode layer 42 when viewed from the upper side is the same as in the above embodiment shown in FIG. 3. The auxiliary electrode layer 42 is patterned before formation of the counter transparent electrode 13. Hence, no insulating protective layers 41 need be formed between the counter transparent electrode 13 and the auxiliary electrode layer 42. In addition, the conducive light-shielding film 44 may be formed between the counter transparent electrode 13 and the auxiliary electrode layer 42.

(Third Modification)

Figure 18:
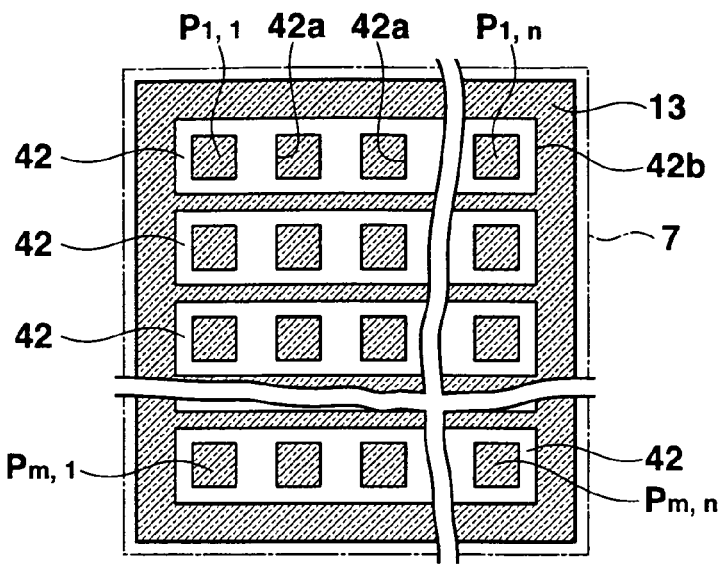
FIG. 18 is a plan view showing the counter transparent electrode and auxiliary electrode layer of organic EL elements in the display unit of still another display apparatus to which the present invention is applied as the third modification.

In the above embodiment, the auxiliary electrode layer 42 is formed into a mesh shape which overlaps the entire region between the pixel electrodes 16. However, as shown in FIG. 18, the auxiliary electrode layer 42 may be divided into a plurality of stripes. More specifically, the auxiliary electrode layers 42 formed into a band shape long in the row direction (horizontal direction) are directly formed on and connected to the counter transparent electrode 13 so as to be continuously arranged around the plurality of pixel electrodes 16 adjacent in the row direction when viewed from the upper side. The auxiliary electrode stripe layers 42 reduce the sheet resistance together with the counter transparent electrode 13. Hence, the voltage can be uniformed in the plane such that the current density for the organic EL elements becomes uniform. The auxiliary electrode stripe layers 42 may be formed not to overlap the selection scan lines $X_1, X_2, \ldots, X_m$ or voltage source scan lines $Z_1, Z_2, \ldots, Z_m$ when viewed from the upper side. To suppress any decrease in aperture ratio of the pixels, the auxiliary electrode stripe layers 42 preferably do not overlap the pixel electrodes 16 when viewed from the upper side.

(Fourth Modification)

Figure 19:
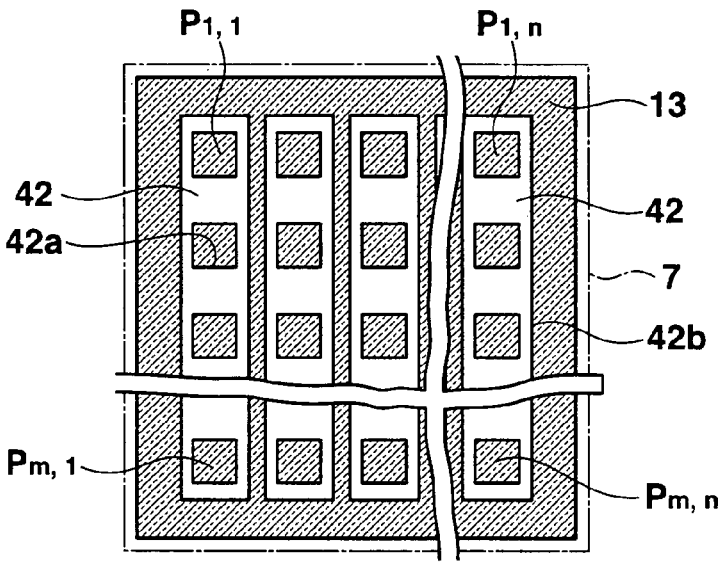
FIG. 19 is a plan view showing the counter transparent electrode and auxiliary electrode layer of organic EL elements in the display unit of still another display apparatus to which the present invention is applied as the fourth modification.

As shown in FIG. 19, the plurality of auxiliary electrode layers 42 formed into a band shape long in the column direction (vertical direction) are directly connected to the counter transparent electrode 13 so as to be continuously arranged around the plurality of pixel electrodes 16 adjacent in the column direction when viewed from the upper side. The auxiliary electrode stripe layers 42 reduce the sheet resistance together with the counter transparent electrode 13. Hence, the voltage can be uniformed in the plane such that the current density for the organic EL elements becomes uniform. With this structure, the auxiliary electrode layers 42 may be formed not to overlap the current lines $Y_1, Y_2, \ldots, Y_n$ when viewed from the upper side. To suppress any decrease in aperture ratio of the pixels, the auxiliary electrode stripe layers 42 preferably do not overlap the pixel electrodes 16 when viewed from the upper side.

(Fifth Modification)

Figure 20:
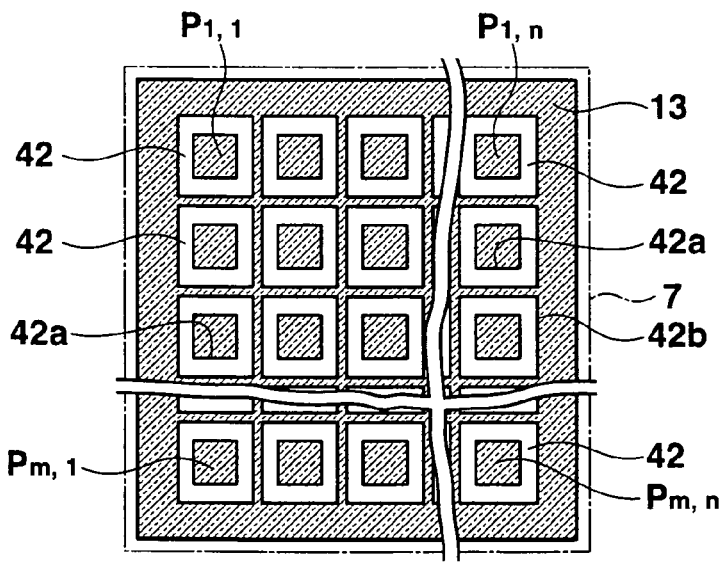
FIG. 20 is a plan view showing the counter transparent electrode and auxiliary electrode layer of organic EL elements in the display unit of still another display apparatus to which the present invention is applied as the fifth modification.

In the above embodiment, the auxiliary electrode layer 42 is continuously formed between the plurality of pixels when viewed from the upper side. However, the present invention is not limited to this. As shown in FIG. 20, the auxiliary electrode layers 42 may be formed individually around the pixel electrodes 16 of the respective pixels. The auxiliary electrode layers 42 may be formed not to overlap the selection scan lines $X_1, X_2, \ldots, X_m$, current lines $Y, Y_2, \ldots, Y_n$, or voltage source scan lines $Z_1, Z_2, \ldots, Z_m$ when viewed from the upper side. To suppress any decrease in aperture ratio of the pixels, the auxiliary electrode layers 42 preferably do not overlap the pixel electrodes 16 when viewed from the upper side.

(Sixth Modification)

Figure 21:
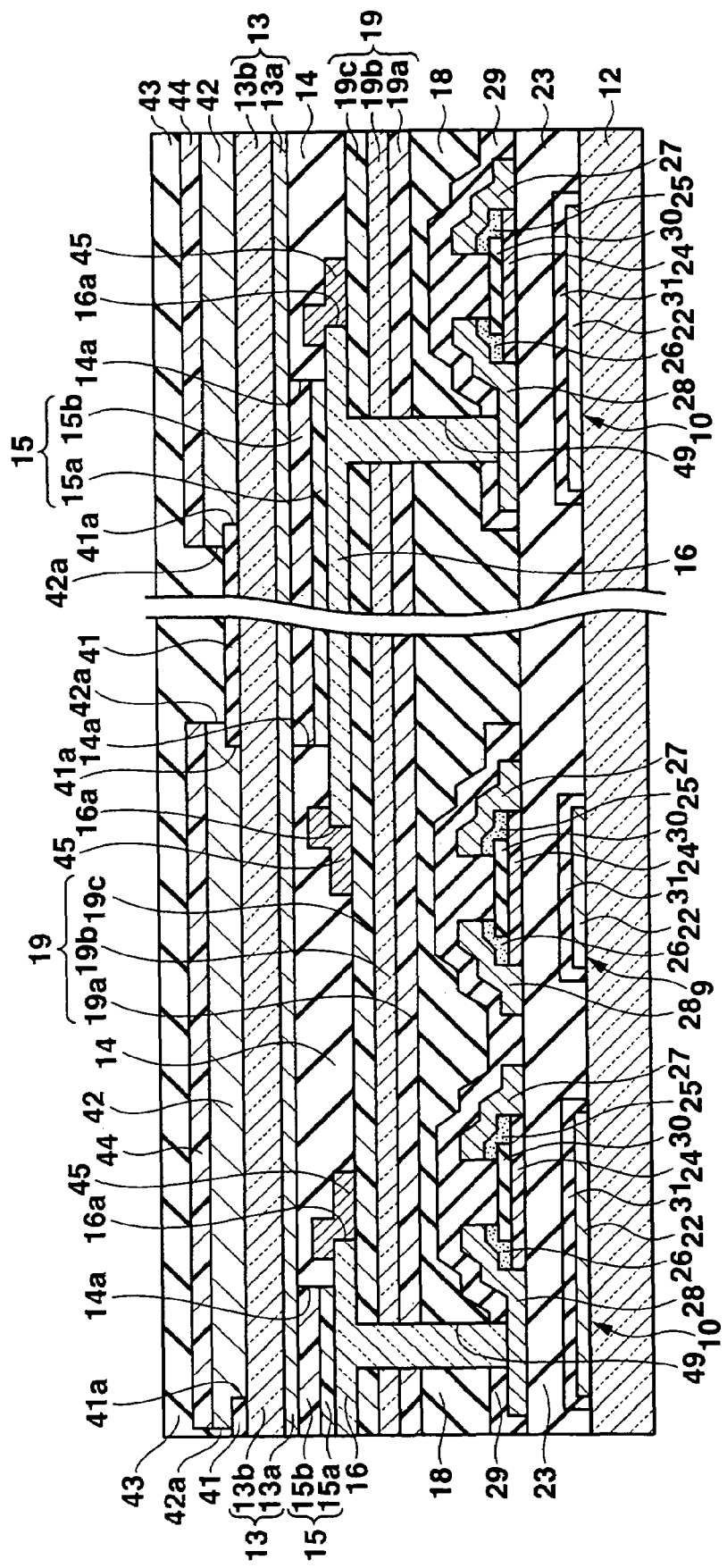
FIG. 21 is a sectional view of still another display apparatus to which the present invention is applied as the sixth modification and which is taken along the line (IV)-(IV) in FIG. 3 in a direction of thickness.

In the above embodiment, the auxiliary electrode layer 42 is formed on the counter transparent electrode 13 having a high resistance to reduce the sheet resistance. If the pixel electrodes 16 are formed as, e.g., transparent electrode by using a metal oxide, and the resistance becomes relatively high, pixel electrode auxiliary electrode layers 45 may be formed to partially overlap the edge portions 16a of the pixel electrodes 16, as shown in FIG. 21. The pixel electrode auxiliary electrode layer 45 is formed electrically independently for each pixel. The pixel electrode auxiliary electrode layer 45 of a given pixel is separated from the pixel electrode auxiliary electrode layer 45 of an adjacent pixel. Each pixel electrode auxiliary electrode layer 45 is formed in a frame shape to surround the corresponding pixel electrode 16 and is in direct contact with it. The upper surfaces of the pixel electrode auxiliary electrode layers 45 adjacent to each other under the auxiliary electrode layer 42 are covered with the liquid-repellent film 14. The EL layers 15 surrounded by the liquid-repellent film 14 are formed on the upper surfaces of the pixel electrodes 16. The counter transparent electrode 13 is formed on the upper surfaces of the EL layers 15 across the plurality of pixels. If the liquid-repellent film 14 can exhibit no sufficient insulating properties between the pixel electrodes 16 and the counter transparent electrode 13, an insulating film having a mesh shape may be formed by using silicon nitride or polyimide, and a film having liquid repellency may be formed on the surface of the insulating film. To decrease the whole thickness, the pixel electrode auxiliary electrode layers 45 are preferably made of a material having a lower resistivity than the pixel electrodes 16. The material can be selected from copper, silver, gold, platinum, aluminum, chromium, and an alloy containing at least one of them. The pixel electrode auxiliary electrode layers 45 may be designed in a smaller width than the auxiliary electrode layer 42 such that the pixel electrode auxiliary electrode layers 45 cannot be seen from the upper side of the auxiliary electrode layer 42. Alternatively, the pixel electrode auxiliary electrode layers 45 may be designed in the same dimensions as those of the auxiliary electrode layer 42 such that they completely overlap the auxiliary electrode layer 42. Only the pixel electrode auxiliary electrode layers 45 may be formed without forming the auxiliary electrode layer 42.

The present invention is not limited to the above-described embodiment and modifications, and various changes and modifications can be made without departing from the spirit and scope of the present invention.

In the above description, as an example of two-dimensional array of the plurality of pixel electrode 16, they are arrayed in a matrix. Instead, the plurality of pixel electrodes 16 may be arranged in a delta array in which triangles are formed by the vertices of adjacent R, G, and B pixels. Alternatively, the pixel electrodes 16 may be arranged in a honeycomb by forming hexagonal pixels. Pixel groups each including a plurality of pixels which emit light of the same color may be arrayed along the column direction such that each pixel group is arranged adjacent to pixel groups including a plurality of pixels which emit light of different colors in the row direction.

In the above description, one organic EL element (i.e., one pixel electrode 16 and one EL layer 15) is arranged in one region surrounded by the auxiliary. electrode layer 42 when viewed from the upper side. However, a plurality of organic EL elements may be arranged in one surrounded region.

The circuit arrangement of the pixel driving circuit $D_{i,j}$ will be described next in detail.

A voltage $V_{NSE}$ applied to the voltage source scan line $Z_i$ during a nonselection period is equal to or higher than the reference potential $V_{SS}$. A voltage $V_{SE}$ applied to the voltage source scan line $Z_i$ during a selection period is equal to or lower than the reference potential $V_{SS}$. The reference potential $V_{SS}$ is, e.g., ground potential.

As shown in FIG. 1, the selection scan driver 3 is connected to the selection scan lines $X_1$ to $X_m$ of the display panel 2. The selection scan driver 3 is a so-called shift register. The selection scan driver 3 sequentially outputs a scan signal to the selection scan lines $X_1$ to $X_m$ in the order from $X_1$ to $X_m$ (the selection scan line $X_1$ follows the selection scan line $X_m$) in accordance with the control signals φs output from the controller 6, thereby sequentially selecting the first transistors 8 and second transistors 9 connected to the selection scan lines $X_1$ to $X_m$. More specifically, when the first transistors 8 and second transistors 9 are n-channel transistors, the selection scan driver 3 selectively applies an ON voltage $V_{ON}$ of high level (sufficiently higher than the reference potential $V_{SS}$) or an OFF voltage $V_{OFF}$ of low level (equal to or lower than the reference potential $V_{SS}$) to the selection scan lines $X_1$ to $X_m$. During a selection period when the selection scan line $X_i$ of the selection scan lines $X_1$ to $X_m$ is selected, the selection scan driver 3 outputs a pulse of the ON voltage $V_{ON}$ to the selection scan line $X_i$. Accordingly, the second transistors 9 and third transistors 10 (all the second transistors 9 and third transistors 10 in the pixel driving circuits $D_{i,1}$ to $D_{i,n}$) connected to the selection scan line $X_i$ are turned on. During a nonselection period except the selection period, the OFF voltage $V_{OFF}$ is applied to the selection scan line $X_i$ so that the second transistors 9 and third transistors 10 are turned off. The selection periods of the selection scan lines $X_1$ to $X_m$ preferably do not overlap each other. However, if a plurality of pixels P connected to the current line $Y_j$ of the same column should emit light of the same gray level, settings may be done such that the selection periods of the selection scan lines $X_1$ to $X_m$ are synchronized, and the selection periods of the voltage source scan lines $Z_1$ to $Z_m$ are synchronized.

The voltage source driver 4 is connected to the voltage source scan lines $Z_1$ to $Z_m$ of the display panel 2. The voltage source driver 4 is a so-called shift register. The voltage source driver 4 sequentially outputs a pulse signal to the voltage source scan lines $Z_1$ to $Z_m$ in the order from $Z_1$ to $Z_m$ (the voltage source scan line $Z_1$ follows the voltage source scan line $Z_m$) in accordance with the control signals be output from the controller 6. More specifically, the voltage source driver 4 applies to the voltage source scan lines $Z_1$ to $Z_m$ a selection voltage (e.g., 0 [V] when the reference potential is ground potential) equal to or lower than the reference potential $V_{SS}$ at a predetermined period. More specifically, during a selection period when the selection scan line $X_i$ of the selection scan lines $X_1$ to $X_m$ is selected, the voltage source driver 4 applies a selection voltage of low level to the voltage source scan line $Z_i$. On the other hand, during a nonselection period, the voltage source driver 4 applies the nonselection voltage $V_{NSE}$ of level higher than the reference potential $V_{SS}$ to the voltage source scan line $Z_i$. The nonselection voltage $V_{NSE}$ may be a negative voltage if it is higher than the reference potential $V_{SS}$. However, the nonselection voltage $V_{NSE}$ has a sufficiently large value such that a drain-to-source voltage $V_{DS}$ of the third transistor 10 reaches a saturated area. The saturation voltage will be described later in detail.

The controller 6 outputs the control signals φs, control signals φe, and control signals φd to the selection scan driver 3, voltage source driver 4, and data driver 5, respectively, in accordance with input image data.

Figure 22:
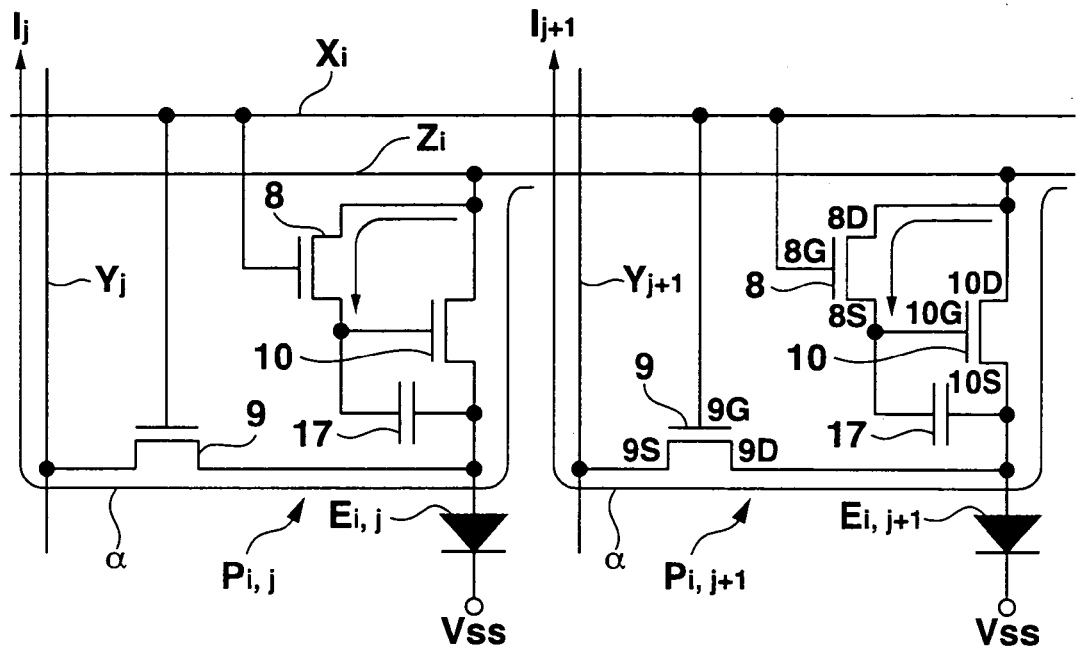
FIG. 22 is an equivalent circuit diagram of pixels in the display apparatus so as to explain the driving principle during the selection period.

The data driver 5 is a current sink driver which draws storage currents toward the data driver 5 from the current lines $Y_1$ to $Y_n$ upon receiving the control signals from the controller 6. That is, the data driver 5 has a current sink circuit and generates storage currents in the current lines $Y_1$ to $Y_n$, as indicated by arrows in FIG. 22. The value of a display current which flows when the organic EL elements $E_{1,1}$ to $E_{m,n}$ emit light during the nonselection period equals that of the storage current. During the selection period, the data driver 5 causes each capacitor 17 to accumulate charges in a magnitude corresponding to the value of the storage current as current data.

The operation principle in the pixels $P_{1,1}$ to $P_{m,n}$ when the data driver 5 supplies storage currents having predetermined values to the current lines $Y_1$ to $Y_n$ will be described.

Figure 24:
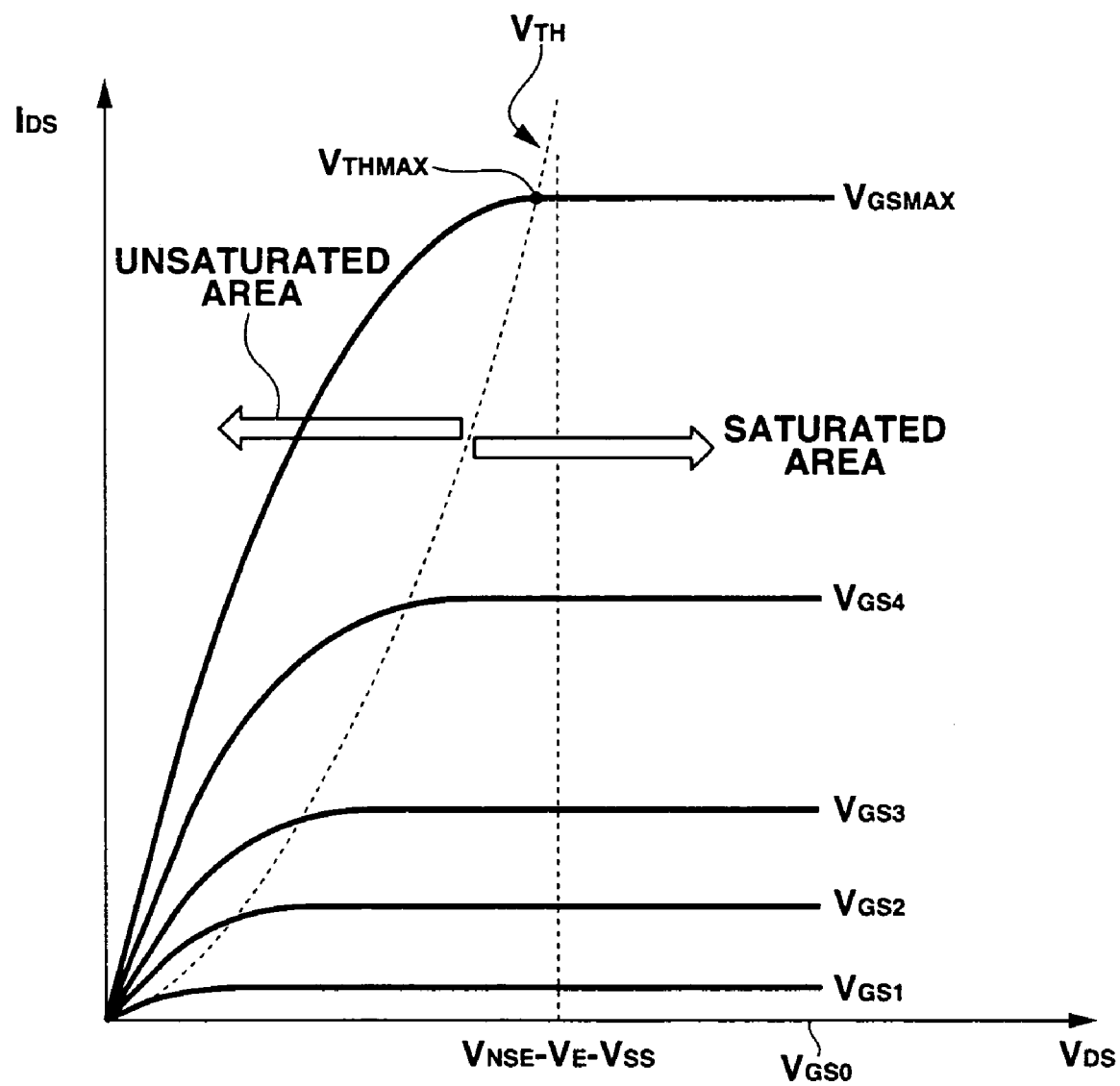
FIG. 24 is a graph showing the relationship between a current which flows to an NMOSFET connected in series with a light-emitting element of the display apparatus and a voltage applied to the NMOSFET.

FIG. 24 is a graph showing the current vs. voltage characteristic of the third transistor 10 as an NMOSFET. Referring to FIG. 24, the abscissa represents the drain-to-source voltage value, and the ordinate represents the drain-to-source current value. In the unsaturated area of a FET, i.e., in the region where the drain-to-source voltage value $V_{DS}$ is smaller than a drain saturation threshold voltage $V_{TH}$ corresponding to a gate-to-source voltage value $V_{GS}$, when the gate-to-source voltage value $V_{GS}$ is constant, a source-to-drain current value $I_{DS}$ increases as the drain-to-source voltage value $V_{DS}$ increases. In addition, in the saturated area shown in FIG. 22, i.e., in the region where the drain-to-source voltage value $V_{DS}$ is equal to or larger than the drain saturation threshold voltage $V_{TH}$ corresponding to the gate-to-source voltage value $V_{GS}$, when the gate-to-source voltage value $V_{GS}$ is constant, the source-to-drain current value $I_{DS}$ is almost constant.

The source-to-drain current value $I_{DS}$ in the saturated area is given by $$I_{DS} = \frac{\mu C_0 Z}{2L}(V_{GS} - V_{TH})^2 \qquad (1)$$

In equation (1), $\mu$ is the mobility of carriers (electrons), $C_0$ is the capacitance using the gate insulating film of the MOS structure as a dielectric, Z is the channel width, and L is the channel length.

Referring to FIG. 24, gate-to-source voltage values $V_{GS0}$ to $V_{GSMAX}$ have a relation $V_{GS0}=0<V_{GS1}<V_{GS2}<V_{GS3}<V_{GS4}<V_{GSMAX}$. That is, when the drain-to-source voltage value $V_{DS}$ is constant, the source-to-drain current value $I_{DS}$ increases in both the unsaturated area and the saturated area as the gate-to-source voltage value $V_{GS}$ increases. In addition, as the gate-to-source voltage value $V_{GS}$ increases, the drain saturation threshold voltage $V_{TH}$ also increases.

As is apparent from the above description, in the unsaturated area, if the drain-to-source voltage value $V_{DS}$ even slightly changes, the source-to-drain current value $I_{DS}$ changes. In the saturated area, however, when the gate-to-source voltage value $V_{GS}$ is defined, the source-to-drain current value $I_{DS}$ is uniquely defined. The source-to-drain current level $I_{DS}$ when the third transistor 10 has the gate-to-source voltage level $V_{GSMAX}$ is set to a current level which flows between the pixel electrode 16 and the counter transparent electrode 13 of the organic EL element $E_{i,j}$ which emits light at the maximum luminance.

Figure 25:
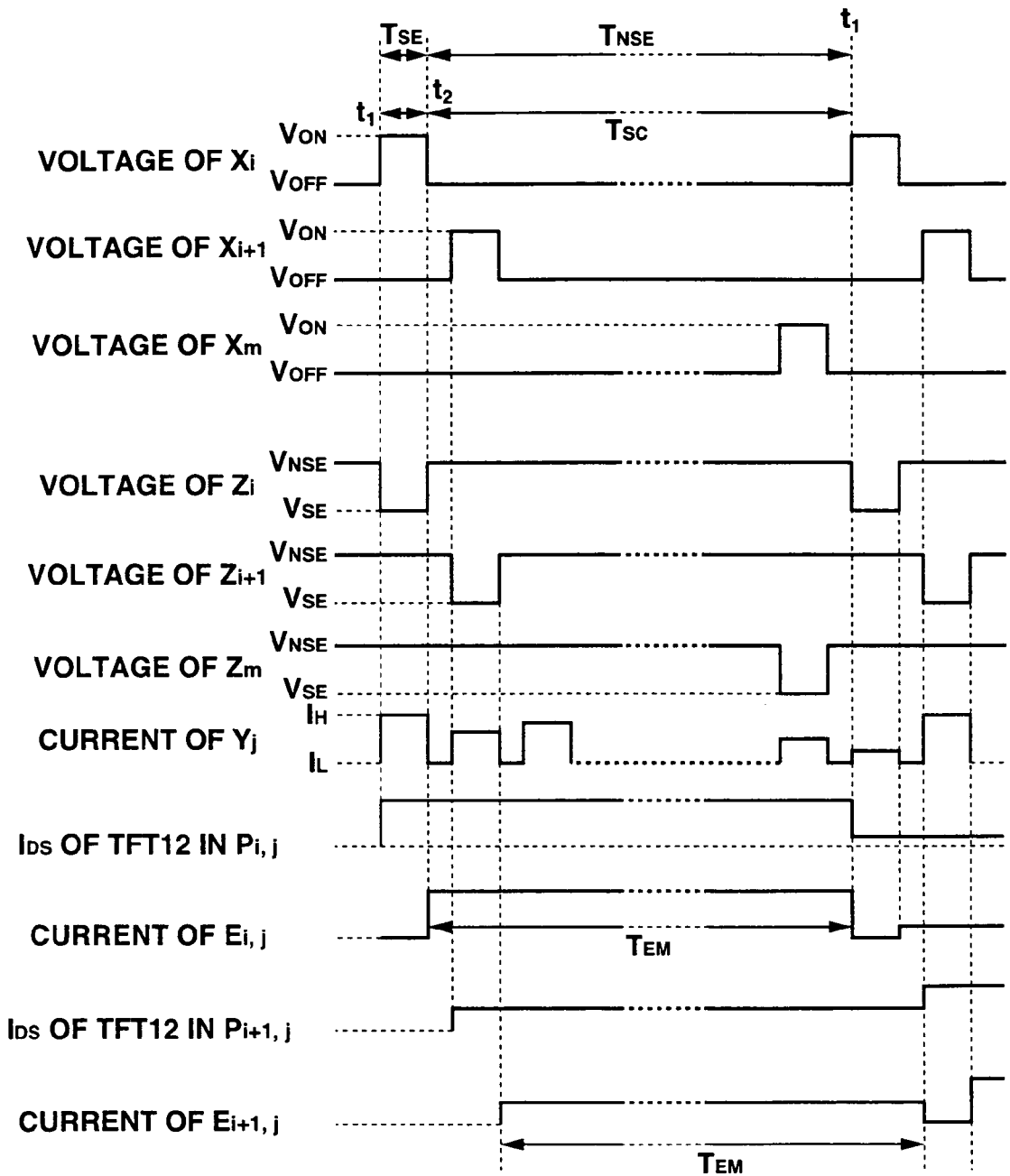
FIG. 25 is a timing chart showing the operation of a driving circuit.

The operation of the pixel driving circuit $D_{i,j}$ having the above-described arrangement, the method of driving the pixel driving circuit $D_{i,j}$, and the operation of the display apparatus 1 will be described next with reference to the timing chart shown in FIG. 25. Referring to FIG. 25, a period $T_{SE}$ is a selection period, a period $T_{NSE}$ is a nonselection period, and a period $T_{SC}$ is one scanning period. Note that $T_{SC}=T_{SE}+T_{NSE}$.

In accordance with the control signals φs output from the controller 6, the selection scan driver 3 sequentially outputs a pulse of high level (ON level) to the selection scan line $X_1$ of the first row to the selection scan line $X_m$ of the mth row. In addition, in accordance with the control signals φe output from the controller 6, the voltage source driver 4 sequentially outputs a pulse of low level to the voltage source scan line $Z_1$ of the first row to the voltage source scan line $Z_m$ of the mth row.

As shown in FIG. 25, in each row, the output timing of the high-level voltage to the selection scan line $X_i$ almost equals the output timing of the low-level pulse to the voltage source scan line $Z_i$. The time length of the high-level voltage of the voltage source scan line $Z_i$ almost equals the time length of the low-level voltage of the voltage source scan line $Z_i$. The period while the high-level pulse and low-level pulse are output is the selection period $T_{SE}$ Of the row. During the selection period $T_{SE}$ of each row, the data driver 5 generates storage currents (i.e., currents toward the data driver 5) for the current lines $Y_1$ to $Y_n$ of all columns in accordance with the control signals φd output from the controller 6. The data driver 5 supplies, to the current line $Y_j$ of each column, a storage current having a value corresponding to image data received by the controller 6.

The current flow and voltage application of the pixel $P_{i,j}$ will be described in detail.

At start time $t_1$ of the selection period $T_{SE}$ of the ith row, the selection scan driver 3 starts outputting the voltage of ON level (high level) to the selection scan line $X_i$ of the ith row. During the selection period $T_{SE}$ from times $t_1$ to $t_2$, the scan signal voltage $V_{ON}$ having a level that turns on the first transistors 8 and second transistors 9 is applied to the selection scan line $X_i$. During the selection period $T_{SE}$ Of the ith row, the selection voltage $V_{SE}$ equal to or lower than the reference potential $V_{SS}$ is applied to the voltage source scan line $Z_i$. In addition, during the selection period $T_{SE}$, the data driver 5 flows storage currents having predetermined values in accordance with image data received by the controller 6.

Accordingly, during the selection period $T_{SE}$, the first transistor 8 is turned on to supply a current from the drain to the source. A voltage is applied to the gate of the third transistor 10 and one terminal of the capacitor 17 to turn on the third transistor 10. Furthermore, during the selection period $T_{SE}$, the second transistor 9 is turned on, and the data driver 5 is going to supply the storage currents corresponding to the image data to the current lines $Y_1, Y_2, \ldots, Y_j, Y_{j+1}, \ldots, Y_n$. At this time, to supply the storage currents to the current lines $Y_1, Y_2, \ldots, Y_{j+1}, \ldots, Y_n$, the data driver 5 sets the current lines $Y_1, Y_2, \ldots, Y_j, Y_{j+1}, \ldots, Y_n$ to a voltage which is equal to or lower than the selection voltage $V_{SE}$ and also equal to or lower than the reference potential $V_{SS}$ to make the source potential in the third transistor 10 lower than the drain potential.

A potential difference is generated between the gate and the source of the third transistor 10. Hence, storage currents $I_1, I_2, \ldots, I_j, I_{j+1}, \ldots, I_n$ having current values designated by the data driver 5 (i.e., current values corresponding to the image data) flow in a direction indicated by an arrow a. During the selection period $T_{SE}$, the selection voltage $V_{SE}$ of the voltage source scan line $Z_i$ is equal to or lower than the reference potential $V_{SS}$. Hence, the potential of the anode of the organic EL element $E_{i,j}$ is lower than the potential of the cathode. That is, a reverse bias voltage is applied to the organic EL element $E_{i,j}$. For this reason, the current from the voltage source scan line $Z_i$ does not flow to the organic EL element $E_{i,j}$.

At this time, the other terminal (connected to the source electrode 10S of the third transistor 10) of each of the capacitors 17 of the pixels $P_{i,1}$ to $P_{i,n}$ has a potential corresponding to the current value controlled (designated) by the data driver 5. The potential is lower than the gate potential of the third transistor 10. More specifically, the capacitor 17 of each of the pixels $P_{i,1}$ to $P_{i,n}$ stores charges which generate a potential difference between the gate and the source of the corresponding third transistor 10 so as to supply a corresponding one of the currents $I_1$ to $I_n$ to the third transistor 10 of the corresponding one of the pixels $P_{i,1}$ to $P_{i,n}$.

The potential at an arbitrary point on the wiring line from the third transistor 10 to the current line $Y_j$ changes depending on, e.g., the internal resistance in the second transistor 9 and third transistor 10, which changes over time. However, the current supplied by current control by the data driver 5 exhibits a predetermined current value. For this reason, even when the resistance of the second transistor 9 and third transistor 10 becomes high, and the potential between the gate and the source of the third transistor 10 changes, the predetermined value of the current that flows in the direction indicated by the arrow α does not change.

Figure 23:
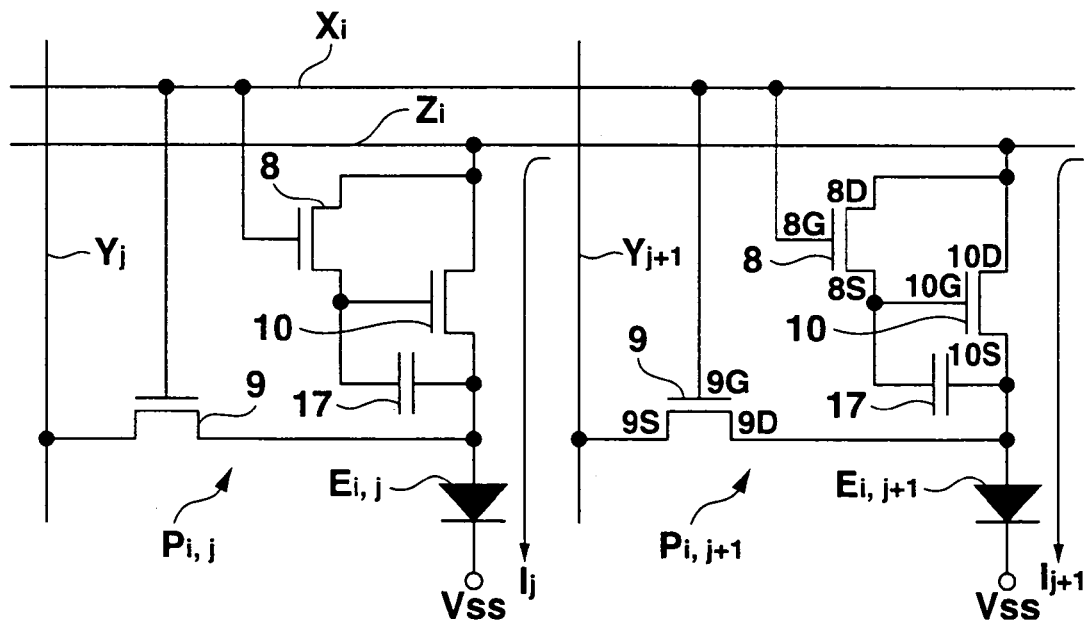
FIG. 23 is an equivalent circuit diagram of pixels in the display apparatus so as to explain the driving principle during the selection period.

At end time $t_2$ of the selection period $T_{SE}$, the high-level pulse output from the selection scan driver 3 to the selection scan line $X_i$ is ended, and the low-level pulse output from the voltage source driver 4 to the voltage source scan line $Z_i$ is ended. That is, during the nonselection period $T_{NSE}$ from end time $t_2$ to start time $t_1$ of the next selection period $T_{SE}$, the scan signal voltage $V_{OFF}$ of OFF level (low potential) is applied to the gates of the first transistors 8 and second transistors 9 on the selection scan line $X_i$. Simultaneously, the nonselection voltage $V_{NSE}$ much higher than the reference potential $V_{SS}$ is applied to the voltage source scan line $Z_i$. For this reason, as shown in FIG. 23, during the nonselection period $T_{NSE}$, the second transistors 9 are turned off, and no currents flow to the current lines $Y_1$ to $Y_n$. Furthermore, during the nonselection period $T_{NSE}$, the first transistors 8 are turned off.

The organic EL element $E_{i,j}$ cannot avoid the degradation over time with which the resistance gradually rises in a long term. Hence, the divided resistance in the organic EL element $E_{i,j}$ gradually rises. When a constant voltage is applied, the voltage applied to a transistor connected in series with the organic EL element $E_{i,j}$ may become relatively low. Let $V_E$ be the maximum internal voltage of the organic EL element $E_{i,j}$, which is necessary for the organic EL element $E_{i,j}$ to emit light at the maximum luminance during the light emission service life period. During the nonselection period $T_{NSE}$ after the selection period $T_{SE}$, as shown in FIG. 24, a condition given by $$V_{NSE} - V_E - V_{SS} \square V_{THMAX} \quad (2)$$

is satisfied such that the source-to-drain path of the third transistor 10 maintains the saturated area even when the gate-to-source voltage $V_{GS}$ of the third transistor 10 is $V_{GSMAX}$, i.e., the source-to-drain current $I_{DS}$ of the third transistor 10 is controlled by only the gate-to-source voltage $V_{GS}$ of the third transistor 10 independently of its drain-to-source voltage $V_{DS}$.

$V_{THMAX}$ is the saturation threshold voltage between the source and the drain of the third transistor 10 at $V_{GSMAX}$. In consideration of the displacement of the saturation threshold value and a variation in characteristics between the plurality of third transistors 10 of the display panel 2, which are caused by the degradation over time of the third transistors 10, $V_{THMAX}$ is set to a voltage which is expected to be maximum within the range where the third transistor 10 can normally drive when $V_{GSMAX}$ is supplied to the gate of the third transistor 10.

The capacitor 17 continuously holds, at one terminal and the other terminal, the charges accumulated during the selection period $T_{SE}$. The third transistor 10 continuously maintains the ON state. That is, the gate-to-source voltage value $V_{GS}$ of the third transistor 10 during the nonselection period $T_{NSE}$ equals that during the selection period $T_{SE}$ before the nonselection period $T_{NSE}$. For this reason, even during the nonselection period $T_{NSE}$, the third transistor 10 continuously supplies the display current equal to the storage current having the value corresponding to the image data in the selection period $T_{SE}$. However, since the second transistor 9 is OFF, the current flows toward the low reference potential $V_{SS}$ through the organic EL element $E_{i,j}$, as indicated by equation (2). Accordingly, the display current, i.e., the source-to-drain current $I_{DS}$ of the third transistor 10 flows to the organic EL layer 15 between the pixel electrode 16 and the counter transparent electrode 13 of the organic EL element $E_{i,j}$ so that the organic EL element $E_{i,j}$ emits light.

As described above, during the selection period $T_{SE}$, the data driver 5 forcibly supplies a storage current between the source and the drain of the third transistor 10 through the current line $Y_j$ in accordance with image data. During the nonselection period $T_{NSE}$, the data driver 5 supplies a display current equal to the extracted storage current to the organic EL element $E_{i,j}$. Hence, the third transistor 10 can supply a desired current corresponding to the image data regardless of the variation in its characteristic or the displacement of the characteristic caused by the degradation over time. In addition, even when the resistance of the organic EL element $E_{i,j}$ rises over time, it can execute stable luminance gray level display because a desired current flows to the organic EL element $E_{i,j}$. In one pixel, only the third transistor 10 serving as a current control transistor is connected in series with the organic EL element $E_{i,j}$. Only two components, i.e., the organic EL element $E_{i,j}$ and third transistor 10 divide the voltage applied to the voltage source scan line $Z_i$. For this reason, driving at a low voltage and low power consumption is possible. In addition, since the number of transistors in a pixel can be suppressed, the occupation area (aperture ratio) of the light emission region of the pixel can be increased.

When the selection period $T_{SE}$ of the selection scan line $X_i$ is ended, the selection period $T_{SE}$ of the selection scan line $X_{i+1}$ starts. The selection scan driver 3, voltage source driver 4, data driver 5, and controller 6 operate in the same way as for the selection scan line $X_i$. In this way, the organic EL elements $E_{1,1}$ to $E_{1,n}, E_{2,1}$ to $E_{2,n}, \ldots, E_{m,1}$ to $E_{m,n}$ are line-sequentially selected, and the selection periods of the selection scan lines $X_1$ to $X_m$ are sequentially ended. After that, the selection period $T_{SE}$ of the selection scan line $X_1$ starts again. As described above, a light emission period $T_{EM}$ when the pixels emit light during one scanning period $T_{SC}$ almost corresponds to the nonselection period $T_{NSE}$. As the number of selection scan lines increases, the light emission period $T_{EM}$ can be made long.

Since the active matrix driving display apparatus 1 using current control can be implemented by forming the three, first transistor 8, second transistor 9, and third transistor 10 in one pixel $P_{i,j}$, the image characteristic of the display apparatus 1 is excellent. That is, in the active matrix driving display apparatus 1 which controls the current value, in the present invention, the ratio of the light emission area of the pixel $P_{i,j}$ can be made high. Hence, extra margins can be ensured as other design margins. When the ratio of the light emission area increases, the apparent brightness of the display surface of the display apparatus 1 can be increased. In addition, in display at a desired apparent brightness, the value of the flowing current per unit area of the EL layer 15 can be made smaller. Hence, the light emission service life of the organic EL element $E_{i,j}$ can be prolonged.

Furthermore, since a reverse bias voltage is applied to the organic EL element $E_{i,j}$ during the selection period $T_{SE}$, the element service life of the organic EL element $E_{i,j}$ becomes long. In the above embodiment, all the first transistor 8, second transistor 9, and third transistor 10 of each pixel driving circuit $D_{i,j}$ are single-channel FETs including only n-channels whose semiconductor layers are made of amorphous silicon. The first transistor 8, second transistor 9, and third transistor 10 can be formed on the substrate 12 simultaneously by one step. For this reason, any increase in time or cost for manufacturing the display panel 2, display apparatus 1, and pixel driving circuits $D_{i,j}$ can be suppressed. Even when p-channel FETs are employed as the first transistor 8, second transistor 9, and third transistor 10, the same effect as described above can be obtained. At this time, the signals shown in FIG. 25 have opposite phases.

In the embodiment, an EL layer is formed in each pixel, a common EL layer or layers may be formed on the all pixels or respective groups of the pixels.

What is claimed is:

1. A display apparatus comprising:
   a substrate having a first surface;
   a plurality of pixel electrodes which are arrayed on a side of said first surface of the substrate;
   at least one EL layer formed on a corresponding one of the pixel electrodes;
   an counter electrode which is formed on the EL layer;
   an auxiliary electrode which is electrically connected to the counter electrode and which is disposed between portions of adjacent pixel electrodes;
   a transparent layer which is formed under the pixel electrodes; and
   a reflecting layer which is formed under the transparent layer and which is in contact with the transparent layer;
   wherein light transmittance increases in order of the reflecting layer, the pixel electrodes, and the transparent layer, and light reflectance increases in order of the transparent layer, the pixel electrodes, and the reflecting layer.

2. An apparatus according to claim 1, wherein a resistivity of the auxiliary electrode is lower than a resistivity of the counter electrode.

3. An apparatus according to claim 1, wherein the counter electrode is transparent, and the auxiliary electrode has a light-shielding effect.

4. An apparatus according to claim 1, wherein the counter electrode has such a characteristic as to pass at least part of a wavelength range of light emission by the EL layer.

5. An apparatus according to claim 1, wherein light emitted by the EL layer is released from the counter electrode.

6. An apparatus according to claim 1, further comprising a light-shielding mask which is formed on the auxiliary electrode while overlapping the auxiliary electrode.

7. An apparatus according to claim 1,
   wherein the auxiliary electrode has a mesh shape and overlaps an entire region between said plurality of pixel electrodes.

8. An apparatus according to claim 1,
   wherein said plurality of pixel electrodes are arrayed in a matrix, and the auxiliary electrode is formed into stripe shape portions, each of which overlaps one of a portion between pixel electrodes adjacent in a horizontal direction or a portion between pixel electrodes adjacent in a vertical direction.

9. An apparatus according to claim 1, further comprising:
   a current line;
   a switch circuit which supplies a storage current having a predetermined current value to the current line during a selection period and stops supplying the storage current to the current line during a nonselection periods; and
   a current storage circuit which stores current data corresponding to the current value of the storage current which flows through the current line during the selection period and supplies a display current having a current value substantially equal to the storage current to the EL layer through the pixel electrode during the nonselection period in accordance with the current data stored during the selection period.

10. An apparatus according to claim 9, wherein the current storage circuit includes a current control transistor which supplies the display current to the EL layer.

11. An apparatus according to claim 9, wherein the switch circuit includes a current path control transistor which has a current path with one end connected to the current line, supplies the storage current to the current line during the selection period, and stops supplying the display current to the current line during the nonselection period.

12. An apparatus according to claim 9, wherein the switch circuit includes a current data write control transistor which controls a write of the current data in the current storage circuit.

13. An apparatus according to claim 1, wherein the auxiliary electrode is divided into a plurality of sections, each of which is positioned around each of the pixel electrodes.

14. An apparatus according to claim 1, further comprising a plurality of pixel electrode-auxiliary electrode layers, each of which is positioned around each of the pixel electrodes, and each of which is formed electrically and independently for a corresponding pixel.

15. A display apparatus comprising:
    a substrate having a first surface;
    a plurality of pixel electrodes which are arrayed on a side of said first surface of the substrate;
    at least one EL layer formed on a corresponding one of the pixel electrodes;
    an counter electrode which is formed on the EL layer;
    an auxiliary electrode which is electrically connected to the counter electrode and which is disposed between portions of adjacent pixel electrodes;
    a transparent layer which is formed under the pixel electrodes;
    a reflecting layer which is formed under the transparent layer and is in contact with the transparent layer; and
    a resonator which resonates at least some light components of light emitted by the EL layer;
    wherein light transmittance increases in order of the reflecting layer, the pixel electrodes, and the transparent layer, and light reflectance increases in order of the transparent layer, the pixel electrodes, and the reflecting layer;
    wherein the resonator comprises a half-reflecting layer which is arranged under the pixel electrodes, the transparent layer which is formed under the half-reflecting layer while being in contact with the half-reflecting layer, and the reflecting layer which is formed under the transparent layer while being in contact with the transparent layer;
    wherein light transmittance increases in order of the reflecting layer, the half-reflecting layer, and the transparent layer, and light reflectance increases in order of the transparent layer, the half-reflecting layer, and the reflecting layer; and
    wherein the pixel electrodes are transparent.

* * * * *